United States Patent
Yang

(10) Patent No.: US 11,843,395 B2
(45) Date of Patent: Dec. 12, 2023

(54) CODING PATTERN, CODING AND READING METHODS FOR SAME, CALIBRATION BOARD, AND CALIBRATION METHOD

(71) Applicant: HANGZHOU HIKROBOT TECHNOLOGY CO., LTD., Zhejiang (CN)

(72) Inventor: Xu Yang, Zhejiang (CN)

(73) Assignee: Hangzhou Hikrobot Co., Ltd., Zhejiang (CN)

( * ) Notice: Subject to any disclaimer, the term of this patent is extended or adjusted under 35 U.S.C. 154(b) by 9 days.

(21) Appl. No.: 17/624,953

(22) PCT Filed: Jul. 4, 2020

(86) PCT No.: PCT/CN2020/100304
§ 371 (c)(1),
(2) Date: Jan. 5, 2022

(87) PCT Pub. No.: WO2021/004414
PCT Pub. Date: Jan. 14, 2021

(65) Prior Publication Data
US 2022/0321146 A1    Oct. 6, 2022

(30) Foreign Application Priority Data

Jul. 5, 2019 (CN) .......................... 201910606064.9
Jul. 5, 2019 (CN) .......................... 201910606513.X

(51) Int. Cl.
*H03M 13/00*    (2006.01)
*H03M 13/15*    (2006.01)
*H03M 13/29*    (2006.01)

(52) U.S. Cl.
CPC ... *H03M 13/1515* (2013.01); *H03M 13/2906* (2013.01)

(58) Field of Classification Search
CPC ...................... H03M 13/1515; H03M 13/2906
See application file for complete search history.

(56) References Cited

U.S. PATENT DOCUMENTS 6,813,377 B1 * 11/2004 Gopalakrishnan ...... G06F 18/28
382/274
10,679,175 B2 * 6/2020 Hosokane ............ G06K 7/1417
(Continued)

FOREIGN PATENT DOCUMENTS

CN       101093553 A    12/2007
CN       104657982 A    5/2015
(Continued)

OTHER PUBLICATIONS

English translation of International Search Report issued in PCT/CN2020/100304 dated Sep. 30, 2020.
(Continued)

*Primary Examiner* — Samir W Rizk
(74) *Attorney, Agent, or Firm* — Meunier Carlin & Curfman LLC

(57) ABSTRACT

The present application discloses a coding pattern, coding and reading methods for the same, a calibration board, and a calibration method. In the present application, the coding pattern comprises four positioning blocks, wherein three of the positioning blocks are located at three corner portions of the coding pattern, and the remaining positioning block only contacts one edge of the coding pattern, thereby forming an asymmetrical distribution configuration of the four positioning blocks. The invention can replace a two-dimensional code standard in the related art, saving the licensing and manufacturing costs of using two-dimensional code generation software in the related art, and is not subject to usage restrictions of the two-dimensional code generation software in the related art. The invention enables accurate and fast positioning of the coding pattern, facilitates quick discovery (Continued)

of an initial coding block position in a coding region, and allows a customizable size of the coding pattern and a customizable size of a coding region in the coding pattern according to a data volume of an application scenario, thereby providing flexibility in configuring data information recorded in the coding pattern. In addition, coding of the coding region is simple, thereby improving efficiency.

27 Claims, 10 Drawing Sheets

(56) References Cited

U.S. PATENT DOCUMENTS

| | | | |
|---|---|---|---|
| 2010/0020970 A1* | 1/2010 | Liu | G06K 7/1093 |
| | | | 380/54 |
| 2016/0275443 A1* | 9/2016 | Hosokane | G06K 19/06037 |
| 2016/0283763 A1 | 9/2016 | Hosokane | |

FOREIGN PATENT DOCUMENTS

| | | | | |
|---|---|---|---|---|
| CN | 104778491 A | 7/2015 | | |
| CN | 104781835 A | 7/2015 | | |
| CN | 109034325 A | 12/2018 | | |
| EP | 2921996 A1 * | 9/2015 | | G06K 19/06037 |

OTHER PUBLICATIONS

Extended European Search Report issued for Application No. 20837644.2, dated Mar. 8, 2022.

* cited by examiner

CODING PATTERN, CODING AND READING METHODS FOR SAME, CALIBRATION BOARD, AND CALIBRATION METHOD

The present application claims the priority to a Chinese patent application No. 201910606064.9 filed with the China National Intellectual Property Administration on Jul. 5, 2019 and entitled "Encoding Method, Encoded Graph, Method for Reading Encoded graph, and Capturing Apparatus" and to a Chinese patent application No. 201910606513.X filed with the China National Intellectual Property Administration on Jul. 5, 2019 and entitled "A Calibration board and Calibration method", the contents of which are incorporated herein by reference in their entirety.

TECHNICAL FIELD

The present application relates to a technical field of calibrating, and in particular, to an encoded graph, coding and reading methods for same, calibration board, and calibration method.

BACKGROUND

In applications of industrial production and machine vision, in order to determine information (such as coordinates) of some key positions in a work piece, mechanism or scenario, key positions of the work piece, mechanism, or scene need to be tagged. By finding and analyzing tags in an image, relevant information of the points indicated by the tags can be determined, which helps reducing the difficulty of subsequent processing. Processing information contained in a tag helps enable a mechanism or software algorithm to automatically and efficiently accomplish specific functions. This method of using tags is widely used in scenarios such as mobile robot positioning, visual navigation, calibration board assisted positioning, and motion estimation.

Two-dimensional code is a common tag. Two-dimensional code is widely used in daily life and industrial production because it has advantages such as high information density and high readability. Two-dimensional code can store more information than traditional bar code, and therefore can contain a certain quantity of redundant information, which increases the anti-noise performance of the code. Based on different mechanisms of error correction, currently used two-dimensional codes can be classified into two types.

One type calculates an error correction code using a data code itself and fills a matrix with the error correction code and the data code together to obtain a complete two-dimensional code. Excellent mathematical properties of an error correction code plays an important role in a decoding stage. Typical examples of this type of two-dimensional codes includes QR (Quick Response) code shown in FIG. 1A and DM (Data Matrix) code shown in FIG. 1B. QR code and DM code generally can correct 15% to 30% of codeword errors.

The data capacity of the QR code and the DM code is fixed. As error correction performance increases, the size of the QR code and the DM code increases with it. The error correction performance of the QR code is classified into four error correction levels: L, M, H, and Q, the maximum error toleration being approximately 30%; the error tolerance of the DM code is lower than 30%. If an actual utilization scenario requires a higher data capacity, the QR code and the DM code will not meet the needs.

The other type is a two-dimensional code that performs error correction using probabilities. This type of two-dimensional codes does not explicitly adds an error correction code, but instead, by a certain sorting mechanism, pre-select in advance a set of codewords with as big a code distance as possible from a large number of codewords to form a coding dictionary and performs coding based on the coding dictionary to obtain a two-dimensional code. As the codeword space is relatively sparse, there is a very low probability that one codeword is exactly received as another codeword, and based on this property, error correction can also be performed on a codeword received. Typical examples of this type of two-dimensional codes include AprilTag code shown in FIG. 2A and ArUco code shown in FIG. 2B.

The AprilTag code and the ArUco code do not have an independent positioning image, after they are detected and a codeword is obtained by image processing, the codeword obtained is compared with an coding dictionary to obtain the best matching decoding. The drawbacks of this type of two dimensional codes are: firstly, in order to ensure that the distance of allowable codewords is maximized, a large number of codewords need to be sorted, which is relatively time consuming and not easy to expand; secondly, during the course of decoding, template matching is used to perform decoding, time consumed increases linearly with the number of codewords, and it is difficult to encompass all complicated situations using codewords.

SUMMARY

In light of the above, embodiments of the present application provide an coding method, encoded graph, method for reading the encoded graph, capturing apparatus, calibration board, calibration method, non-volatile computer readable storage medium, and electronic device, so as to save the authorization cost and manufacturing cost of using a two-dimensional code.

The technical solutions of embodiments of the present application are achieved as follows:

an encoding method, including:
receiving data to be encoded;
encoding the data to be encoded to generate encoded data;
recording the encoded data in an encoded graph;
wherein, the encoded graph is a square, including:
a first positioning block located at a first corner region in the encoded graph;
a second positioning block located at a second corner region in the encoded graph, wherein, the second corner region and the first corner region are not located on a same diagonal line of the encoded graph;
a third positioning block located at a third corner region in the encoded graph, wherein, the third corner region and the second corner region are located on a same diagonal line of the encoded graph;
a fourth positioning block located in the encoded graph;
an encoded region located in a region not occupied by four positioning blocks in the encoded graph, and the encoded data is recorded in the encoded region, the four positioning blocks including the first positioning block, the second positioning block, the third positioning block, and the fourth positioning block;
wherein, in a quadrilateral formed by centers of the four positioning blocks, an inner corner at a location of the fourth positioning block is the largest inner corner of the quadrilateral, and a distance between the center of the fourth positioning block and the center of the third positioning block is smaller than a distance between the center of the fourth positioning block and the center of the second positioning block.

An encoded graph, the encoded graph being a square, including:

a first positioning block located at a first corner region in the encoded graph;

a second positioning block located at a second corner region in the encoded graph, wherein, the second corner region and the first corner region are not located on a same diagonal line of the encoded graph;

a third positioning block located at a third corner region in the encoded graph, wherein, the third corner region and the second corner region are located on a same diagonal line of the encoded graph;

a fourth positioning block located in the encoded graph;

an encoded region located in a region not occupied by the four positioning blocks in the encoded graph, and readable information is recorded in the encoded region, the four positioning blocks including the first positioning block, the second positioning block, the third positioning block, and the fourth positioning block;

wherein, in a quadrilateral formed by centers of the four positioning blocks, an inner corner at the location of the fourth positioning block is the largest inner corner of the quadrilateral, and a distance between the center of the fourth positioning block and the center of the third positioning block is smaller than a distance between the center of the fourth positioning block and the center of the second positioning block.

A method for reading an encoded graph, including:

acquiring an image containing an encoded graph, the image is obtained by photographing an object surface containing the encoded graph;

recognizing four positioning blocks in the encoded graph in the image;

determining a mapping relationship of the encoded graph from the image to a non-perspective distortion plane based on the four positioning blocks, and transforming the encoded graph in the image into the non-perspective distortion plane based on the mapping relationship to obtain an encoded graph front view;

reading an encoded region in which readable information is recorded in the encoded graph front view to obtain information recorded by the encoded graph;

wherein, centers of the four positioning blocks form a quadrilateral, and the step of recognizing four positioning blocks in the encoded graph in the image includes:

determining a positioning block at the largest inner corner of the quadrilateral as a fourth positioning block, determining a positioning block nearest to the fourth positioning block among positioning blocks connected by two sides of the largest inner corner as a third positioning block, determining a positioning block furthest from the fourth positioning block among the positioning blocks connected by the two sides of the largest inner corner as a second positioning block, and determining the remaining positioning block as a first positioning block.

A capturing apparatus, including a capturing unit and a processor, the capturing unit is used for capturing an object surface containing an encoded graph to obtain an image containing the encoded graph;

the processor is used for:

recognizing four positioning blocks in the encoded graph in the image;

determining a mapping relationship of the encoded graph from the image to a non-perspective distortion plane based on the four positioning blocks, and transforming the encoded graph in the image into the non-perspective distortion plane based on the mapping relationship to obtain an encoded graph front view;

reading an encoded region in which readable information is recorded in the encoded graph front view to obtain information recorded by the encoded graph;

wherein, centers of the four positioning blocks form a quadrilateral, and the step of recognizing four positioning blocks in the encoded graph in the image includes:

determining a positioning block at the largest of the four inner corners of the quadrilateral as a fourth positioning block, determining a positioning block nearest to the fourth positioning block as a third positioning block, determining a positioning block furthest from the fourth positioning block as a second positioning block, and determining the remaining positioning block as a first positioning block.

A calibration board, including:

a substrate;

a feature pattern printed to a surface of the substrate and containing a plurality of feature points;

an encoded graph that is a square and covers the feature pattern; wherein, the encoded graph including:

four positioning blocks and an encoded region, the four positioning blocks includes a first positioning block, a second positioning block, a third positioning block, and a fourth positioning block; wherein, the first positioning block, the second positioning block, and the third positioning block are located respectively at a first corner region, a second corner region, and a third corner region of the encoded graph, wherein, the second corner region and the third corner region are two corner regions on a diagonal line of the encoded graph;

the encoded data is located in a region not occupied by the four positioning blocks in the encoded graph, the encoded region records calibration information of a marking point of the encoded graph, wherein, the marking point coincides with one of the feature points in the feature pattern;

the fourth positioning block is embedded in the encoded region, and in a quadrilateral formed by centers of the four positioning blocks, an inner corner at the location of the fourth positioning block is the largest inner corner of the quadrilateral, and a distance between the center of the fourth positioning block and the center of the third positioning block is smaller than a distance between the center of the fourth positioning block and the center of the second positioning block.

A calibration method, including:

capturing a calibration board image containing a calibration board as described in any of the above, and extracting calibration information from the calibration board image;

performing calibration processing based on the extracted calibration information.

A non-volatile computer readable storage medium, the non-volatile computer readable storage medium storing instructions that, when executed by a processor, cause the processor to execute steps in the encoding method as described in any of the above.

A non-volatile computer readable storage medium, the non-volatile computer readable storage medium storing instructions that, when executed by a processor, cause the processor to execute steps in the method for reading the encoded graph as described in any of the above.

A non-volatile computer readable storage medium, the non-volatile computer readable storage medium storing instructions that, when executed by a processor, cause the processor to execute steps in the calibration method as described in any of the above.

An electronic device, including:
at least one processor; and
a memory communicatively connected to the at least one processor; wherein,
the memory stores instructions that can be executed by the at least one processor, the instructions is executed by the at least one processor, to cause the at least one processor to execute steps in the encoding method as described in any of the above.

An electronic device, including:
at least one processor; and
a memory communicatively connected to the at least one processor; wherein,
the memory stores instructions that can be executed by the at least one processor, the instructions being executed by the at least one processor, to cause the at least one processor to execute steps in the method for reading the encoded graph as described in any of the above.

An electronic device, including:
at least one processor; and
a memory communicatively connected to the at least a processor; wherein,
the memory stores instructions that can be executed by the at least one processor, the instructions being executed by the at least one processor, to cause the at least one processor to execute steps in the calibration method as described in any of the above.

A computer program that, when executed by a processor, causes the processor to execute steps in the encoding method as described in any of the above.

A computer program that, when executed by a processor, causes the processor to execute steps in the method for reading the encoded graph as described in any of the above.

A computer program that, when executed by a processor, causes the processor to execute steps in the calibration method as described in any of the above.

It can be seen from the technical solutions above that, in the encoding method, encoded graph, encoded graph reading method, capturing apparatus, calibration board, calibration method, non-volatile computer readable storage medium, and electronic device of embodiments of the present application, two-dimensional code standards in the relevant art are replaced, which saves the authorization cost and manufacturing cost needed when generating a two-dimensional code using a two-dimensional code generating software in the relevant art, and is not limited to the utilization limit of a two-dimensional code generating software in the relevant art.

In addition, in embodiments of the present application, three of the four positioning blocks are located respectively at three corners of the encoded graph, while the other positioning block is tangent to only a side of the encoded graph. The four positioning blocks form an asymmetric distribution configuration. Thus, embodiments of the present application achieves accurate and rapid positioning of the encoded graph using this asymmetric distribution configuration, ensuring accurate reading of the encoded region. At the same time, embodiments of the present application set a direction of the encoded graph by using the four positioning blocks of the asymmetric distribution configuration, so as to facilitate rapidly finding the location of a starting encoded block in the encoded region, and by reading each row of encoded blocks sequentially in the order from top to bottom and from left to right, so as to achieve accurate and rapid reading of information recorded in the encoded region.

In addition, in embodiments of the present application, the asymmetric distribution configuration of the four positioning blocks carries with itself direction information, and by using the asymmetric distribution configuration, a direction of the encoded graph can be determined, which can overcome the mirror image problem created by a symmetric disposition and solve the problem that a direction of the encoded graph cannot be determined as a result of the mirror image problem. Thus, when reading data in two, positive and negative, directions of the encoded graph, the direction of the encoded graph can be recognized and thus an objective of reading data of the same encoded graph in two, positive and negative, directions can be achieved, thereby increasing the range of application of the encoded graph.

Embodiments of the present application can set the size of the encoded graph and the size of the encoded region in the encoded graph based on the quantity of data of an application scenario, so as to flexibly provide data information recorded in the encoded graph. In embodiments of the present application, the RS (Reed-Solomon) error correction mechanism is used to make the encoded region have error correction performance, which can correct the error code that does not exceed the error correction capacity. The approach of encoding the encoded region in embodiments of the present application is simple and improves encoding efficiency, especially with more prominent results for scenarios that have a relatively small data quantity of encoded data.

DETAILED DESCRIPTION

In order to make the objects, technical solutions, and advantages of the present application more clear, the present application will be further described in detail below with reference to the accompanying drawings and embodiments.

Figure 1A:
FIG. 1A is a schematic diagram of a QR code in the prior art.
Figure 1B:
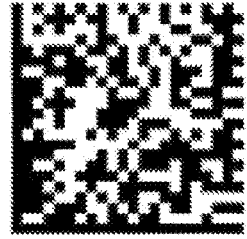
FIG. 1B is a schematic diagram of a DM code in the prior art.
Figure 2A:
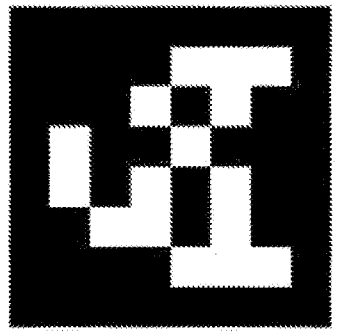
FIG. 2A is a schematic diagram of an AprilTag code in the prior art.
Figure 2B:
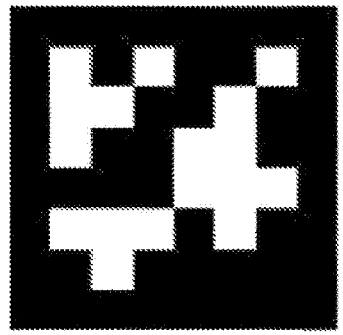
FIG. 2B is a schematic diagram of an ArUco code in the prior art.
Figure 3A:
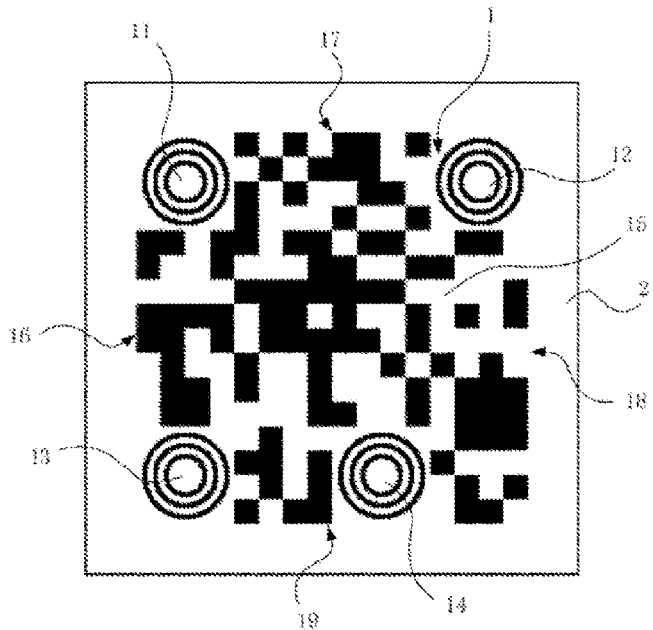
FIG. 3A is a schematic diagram of a encoded graph provided by an embodiment of the present application.
Figure 3B:
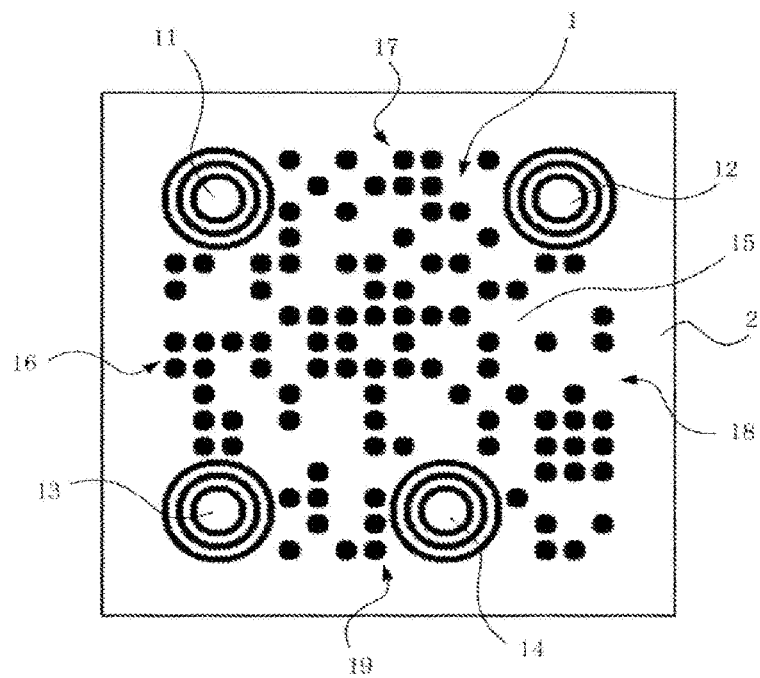
FIG. 3B is a schematic diagram of a encoded graph provided by an embodiment of the present application.

As shown in FIG. 3A and FIG. 3B, an encoded graph is provided by an embodiment of the present application. The encoded graph 1 is a square and includes a first positioning block 11, a second positioning block 12, a third positioning block 13, and a fourth positioning block 14. The first positioning block 11, the second positioning block 12 and the third positioning block 13 are respectively located at a first corner region, a second corner region and a third corner region of the encoded graph 1. The second corner region and the first corner region are not located on a same diagonal line of the encoded graph 1; that is, the second corner region and the first corner region are two corner regions located on different diagonal lines of the encoded graph 1. The third corner region and the second corner region are located on a same diagonal line of the encoded graph 1; that is, the second corner region and the third corner region are two corner regions located on a same diagonal line of the encoded graph 1. In the embodiments shown in FIGS. 3A and 3B, the first corner region is the upper left corner region, the second corner region is the upper right corner region, and the third corner region is the lower left corner region. The upper right corner region and the lower left corner region are two corner regions on the diagonal line from the upper right corner to the lower left corner of the encoded graph 1. The fourth positioning block 14 is located in the encoded graph 1.

As shown in FIGS. 3A and 3B, the encoded graph 1 further includes an encoded region 15. The encoded region 15 is located at a region not occupied by the four positioning blocks in the encoded graph 1. The four positioning blocks comprise the aforementioned first positioning block 11, the second positioning block 12, the third positioning block 13 and the fourth positioning block 14. The encoded region 15 records information that can be read; that is, the encoded region records encoded data.

As shown in FIGS. 3A and 3B, in a quadrilateral formed by centers of the four positioning blocks, an inner corner at the location of the fourth positioning block 14 is the largest inner corner of the quadrilateral, and a distance between the center of the fourth positioning block 14 and the center of the three positioning blocks 13 is smaller than a distance between the center of the fourth positioning block 14 and the center of the second positioning block 12. That is, a line connecting the center of the fourth positioning block 14 and the center of the third positioning block 13 is named a first connection line, and a line connecting the center of the fourth positioning block 14 and the center of the second positioning block 12 is named a second connecting line, the angle between the first connecting line and the second connecting line is the largest inner corner of the quadrilateral. The distance between the center of the fourth positioning block 14 and the center of the third positioning block 13 is named a first distance, and the distance between the center of the fourth positioning block 14 and the center of the second positioning block 12 is named a second distance, them the first distance is smaller than the second distance.

In an optional embodiment, as shown in FIGS. 3A and 3B, in the embodiment of the present application, the encoded graph 1 has a first edge 16, a second edge 17, a third edge 18, and a fourth edge 19. The first edge 16 perpendicularly intersects the second edge 17, the second edge 17 perpendicularly intersects the third edge 18, the third edge 18 perpendicularly intersects the fourth edge 19, and the fourth edge 19 perpendicularly intersects the first edge 16. As shown in FIGS. 3A and 3B, the first edge 16 is the left edge of the encoded graph 1, the second edge 17 is the upper edge of the encoded graph 1, the third edge 18 is the right edge of the encoded graph 1, and the fourth edge 19 is the lower edge of the encoded graph 1.

The edge of the first positioning block 11 is tangent to both the first edge 16 and the second edge 17, the edge of the second positioning block 12 is tangent to both the second edge 17 and the third edge 18, and the edge of the third positioning block 13 is tangent to both the first edge 16 and the fourth edge 19, and the edge of the fourth positioning block 14 is tangent to only the fourth edge 19.

In an optional embodiment, the shapes and sizes of the first positioning block 11, the second positioning block 12, the third positioning block 13 and the fourth positioning block 14 are the same. In an optional embodiment, the first positioning block 11, the second positioning block 12, the third positioning block 13, and the fourth positioning block 14 are a plurality of circular ring shapes, which are all concentrically arranged and have alternating colors. In other words, each of the four positioning blocks are composed of a plurality of circular rings that are concentric and have alternating colors. For example, a plurality of black and white circular rings as shown in FIG. 3A and FIG. 3B. In other optional embodiments, the four positioning blocks may be composed of a plurality of regular triangles, squares, or other various regular polygonal rings that are concentric and have alternating colors. In other optional embodiments, the four positioning blocks may be solid positioning blocks, such as circular blocks, square blocks, or polygonal blocks.

In an optional embodiment, the direction on the side of the second edge 17 is defined as up, the direction on the side of the first edge 16 is defined as left, the direction on the side of the third edge 18 is defined as right, and the direction on the side of the fourth edge 19 is defined as down. Then the direction of the encoded graph 1 can be determined according to the four positioning blocks.

As shown in FIGS. 3A and 3B, the encoded region 15 is a data point matrix, and the data point matrix is composed of a plurality of encoded blocks, and one encoded block can be understood as one data point. The encoded blocks in the data point matrix can be square points (as shown in FIG. 3A), and the encoded blocks in the data point matrix can also be circular points (as shown in FIG. 3B).

In an optional embodiment, the encoded blocks include two-color encoded blocks, and the two-color encoded blocks can be distinguished from each other. The encoded block of one color represents 0, and the encoded block of the other color represents 1. For example, as shown in FIGS. 3A and 3B, two-color encoded blocks of black and white are used.

In other optional embodiments, encoded blocks in other color combinations other than the combination of black and white may be used, such as encoded blocks of the combination of red and white, black and yellow, or blue and yellow. When selecting the color of an encoded block, priority is given to the degree of easiness of reading the encoded region 15 to avoid misreading caused by color values that are too close between the two colors. In the embodiment shown in FIGS. 3A and 3B, the black encoded block can be represented as 1, the white encoded block can be represented as 0; or the black encoded block can be represented as 0, and the white encoded block can be represented as 1.

In an optional embodiment, the recording order of the information in the encoded region 15 in the embodiment shown in FIGS. 3A and 3B is: starting from the first row adjacent to the second edge 17 in the data point matrix (such as the first row from the top shown in FIGS. 3A and 3B), recording information from the side close to the first edge 16 (such as the left side shown in FIGS. 3A and 3B) to the side close to the third edge 18 (such as the right side shown in FIGS. 3A and 3B). As shown in FIGS. 3A and 3B, in the order from left to right, respective encoded blocks for recording information are formed in the first row of the data point matrix; then, in the order from left to right, respective encoded blocks for recording information are formed in the second row of the data point matrix, and so on. Finally, in the order from left to right, respective encoded blocks for recording information are formed in the last row of the data point matrix. As shown in FIGS. 3A and 3B, since the fourth positioning block 14 divides the last few rows of encoded blocks into left and right parts, the recording order of information in the last few rows is as follows: first in the order from left to right, an encoded block for recording information is formed in the left part of the fourth positioning block 14 in this row, and then the fourth positioning block 14 is skipped, and in the order from left to right, an encoded block for recording information is formed in the right part of the fourth positioning block 14 in this row.

Figure 4:
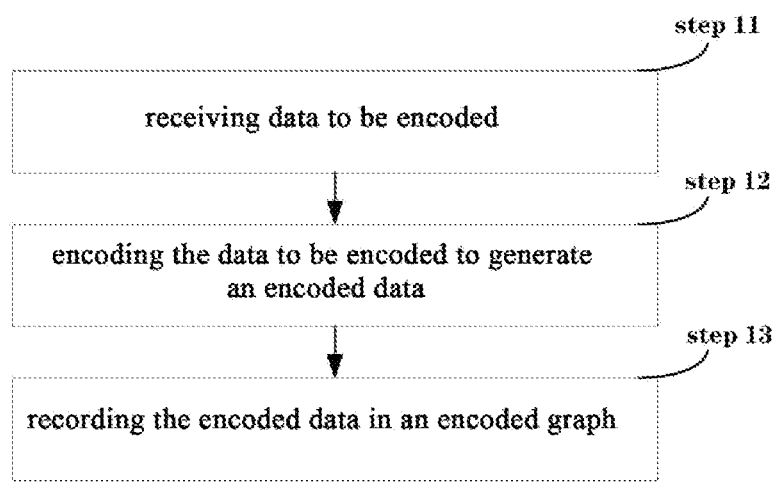
FIG. 4 is a flow chart of an encoding method provided by an embodiment of the present application.

An embodiment of the present application further provides an encoding method, as shown in FIG. 4, which includes:

step 11, receiving data to be encoded;

step 12, encoding the data to be encoded to generate encoded data;

step 13, recording the encoded data in an encoded graph.

The encoded graph is the encoded graph 1 described in the above embodiments, and its structure is shown in FIGS. 3A and 3B. Reference can be made to the description of the above embodiments for details, which will not be repeated here.

In an optional embodiment, recording the encoded data in an encoded graphic in step 13 may comprise:

taking a row in which encoded blocks nearest to the second edge in the encoded region are located as a starting encoded row, taking a row in which encoded blocks nearest to the fourth edge in the encoded region are located as a final encoded row, and in each row of encoded blocks, taking a encoded block nearest to the first edge as a starting encoded block and taking a encoded block nearest to the third edge as a final encoded block, and recording the encoded data in the encoded region in an order from the starting encoded row to the final encoded row and an order from the starting encoded block to the final encoded block in each encoded row.

In an optional embodiment, in the process of recording the encoded data in the encoded region:

when forming an encoded row interrupted by the fourth positioning block, forming encoded blocks in the encoded row with the fourth positioning block skipped.

In an optional embodiment, before recording the encoded data in the encoded graph in step 13, the encoding method of the embodiment of the present application further includes:

determining a side length of the encoded graph based on encoded information. The encoded information includes a bit number of the encoded data, a side length of each encoded block in the encoded region, and a side length of a region occupied by any positioning block.

In an optional embodiment, the side length of the encoded graph is positively correlated to the above-mentioned encoded information.

Specifically, in an optional embodiment, a formula is used to express the relationship between the side length of the encoded graph and the above-mentioned encoded information. The side length of region occupied by any positioning block is denoted as m, and the number of bits of the data to be encoded is denoted as k, and the number of bits of a preset error correction capacity is denoted as 2t, where m, k, and t are all expressed using the side length of one encoded block as an elemental unit. Then, $$a = \mathrm{ceil}(2\sqrt{m^2 + 2k + 4t})$$

where, a is the side length of the encoded graph, ceil(x) represents to find the smallest integer not less than x. The encoded graph can also be called a mosaic region. Here, a represents a times the side length of the encoded block.

In an optional embodiment, as shown in FIGS. 3A and 3B, a static region 2 is provided around the encoding graph. The static region is used for isolating the encoded graph from other graphs. If the number of bits of a surrounding static region of the encoded graph is calculated, then $$a' = \mathrm{ceil}(2\sqrt{m^2 + 2k + 4t}) + 2q$$

where, a' is the total side length of the encoded graph plus the surrounding static region, q is the bit number of the static region, and q is expressed using the side length of one encoded block as an elemental unit. Here, a' is actually a' times the side length of the encoded block.

In an optional embodiment, the encoding the data to be encoded to generate encoded data in step 12, includes:

encoding the data to be encoded using a RS error correction encoding algorithm to obtain encoded data.

In an optional embodiment, after generating the encoded data in step 12, and before recording the encoded data in an encoded graph, the encoding method of the present application further includes:

performing bit XOR processing on the encoded data with a data mask matrix to obtain processed encoded information.

In this case, the recording the encoded data in the encoded graph in step 13 includes:

recording the processed encoded information in the encoded graph.

For the RS error correction encoding algorithm and the data mask matrix can be described in detail in the following description.

Take an embodiment as an example, recording the data to be encoded in the encoded region may comprise the following steps.

Step a1, inputting the data to be encoded. Here, the data to be encoded is the data code.

Step a2, calculating a Galois field generator polynomial g(x), where, the Galois field base is 2, and x denotes data codes. A generator polynomial represents the product of 2t first-degree polynomials, 2t denotes a preset number of bits of the error correction capacity.

$$g(x) = \prod_{t=0}^{2t-1}(x - 2^t)$$

Step a3, performing RS error correction encoding.
Supposing the polynomial d(x) of the data code is:

$$d(x) = \sum_{i=0}^{k-1} d_i x^i$$

where, $d_i$ is a preset coefficient of the i bit of the data code, and x represents the data code. The polynomial of the error correction code is the remainder obtained by dividing $x^{2t}/d(x)$ by the polynomial g(x).

Figure 5:
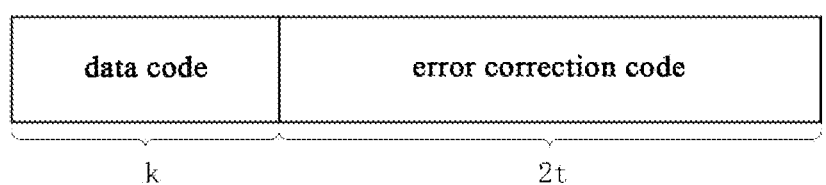
FIG. 5 is a schematic diagram of the arrangement of data codes and error correction codes in an encoded region of an encoded graph in an embodiment of the present application.

The error correction code is placed after the data code, as shown in FIG. 5, to obtain the encoded data, and thus the error correction encoding is complete. Alternatively, the error correction code can be placed before the data code to obtain the encoded data, and thus the error correction encoding is complete.

Step a4, converting the data code and the error correction code into a bit stream, each bit in the bit stream corresponding to each encoded block in the encoded region. The encoded blocks of different colors represent different information, where black represents 0 and white represents 1; or white represents 0 and black represents 1.

Step a5: applying the data mask matrix to obtain a final encoding result, that is, the color of each encoded block. In order to prevent the aggregation of encoded blocks of the same color in the encoded region, a data mask matrix of alternating 0 and 1 is applied to the encoded region. The data mask matrix formula is:

mask=(row+col) %2.

where, row is the row number of the encoded block, col is the column number of the encoded block, and mask is the mask value. XOR operation is performed on the mask with the value of the encoded block at the corresponding position to obtain the final encoding result. The advantage of using a data mask matrix to perform bit XOR operation is that it can reduce the occurrence of black and white aggregation of black and white encoded blocks when the encoded region is relatively large, thus improving the efficiency of dividing during decoding.

Step a6: filling the encoded region sequentially with the encoded blocks included in the final encoding result.

Figure 6:
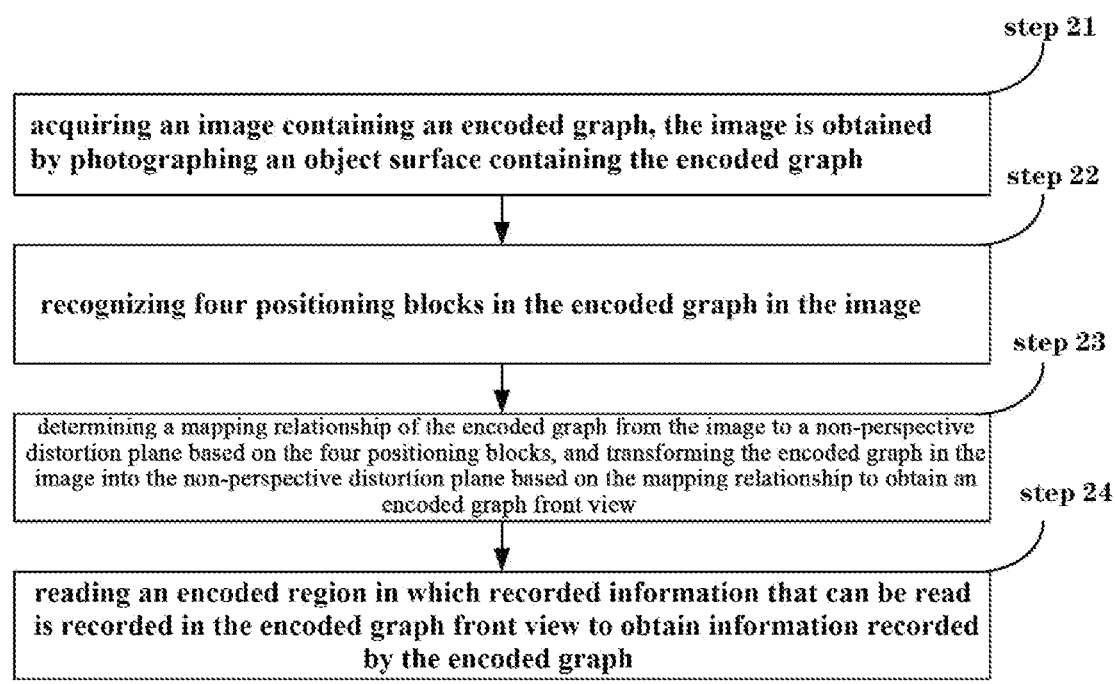
FIG. 6 is a flow chart of a method for reading an encoded graphic provided by an embodiment of the present application.

As shown in FIG. 6, in combination with the encoded graph shown in FIGS. 3A and 3B, a method for reading an encoded graph in an embodiment of the present application mainly includes:

step 21, acquiring an image containing an encoded graph, the image is obtained by photographing an object surface containing the encoded graph;

step 22, recognizing four positioning blocks in the encoded graph in the image;

step 23, determining a mapping relationship of the encoded graph from the image to a non-perspective distortion plane based on the four positioning blocks, and transforming the encoded graph in the image into the non-perspective distortion plane based on the mapping relationship to obtain an encoded graph front view;

Step 24, reading an encoded region in which recorded information that can be read is recorded in the encoded graph front view to obtain information recorded by the encoded graph.

Specifically, step 24 is to read the encoded region in which the readable information is recorded in the encoded graph front view to obtain the information recorded by the encoded graph.

In an optional embodiment, centers of the four positioning blocks included in the encoded graph form a quadrilateral. The step 22 of recognizing four positioning blocks in the encoded graph in the image may comprise:

determining a positioning block at the largest inner corner of the quadrilateral as a fourth positioning block, determining a positioning block nearest to the fourth positioning block among the positioning blocks connected by two sides of the largest inner corner as a third positioning block, determining a positioning block furthest from the fourth positioning block among the positioning blocks connected by the two sides of the largest inner corner as a second positioning block, and determining the remaining positioning block as a first positioning block.

In an optional embodiment, in step 22, following method is used for recognizing four positioning blocks in the encoded graph:

determining four graphic objects that have a same shape and size in the encoded graph in the image as the four positioning blocks.

Specifically, step 22 may comprise recognizing four graphic objects that have a same shape and size in the encoded graph in the image; and determining the four graphic objects that have a same shape and size as the four positioning blocks.

Combined with FIGS. 3A and 3B, the first positioning block 11, the second positioning block 12, the third positioning block 13 and the fourth positioning block 14 are of the same size and shape, which facilitates the identification of each positioning block, and then in step 22, a same means (method) is used to complete the identification of the four positioning blocks.

In an optional embodiment, in step 22, the above method for recognizing four positioning blocks in the encoded graph may further comprise:

determining four graphic objects, each of which is all composed of a plurality of circular rings that are concentric and have alternating colors, as the four positioning blocks.

As shown in FIGS. 3A and 3B, the first positioning block 11, the second positioning block 12, the third positioning block 13 and the fourth positioning block 14 are all composed of a plurality of circular rings that are concentric and have alternating colors. The shape composed of a plurality of circular rings that are concentric and have alternating colors can be distinguished from the characteristics of the surrounding environment (such as the encoded region), which can improve the recognition success rate.

In an optional embodiment, in step 22, the quadrilateral is constructed as follows:

extracting the centers of the four positioning blocks, and connecting the centers of the four positioning blocks sequentially to form the quadrilateral.

Referring to FIG. 3A or FIG. 3B, in step 22, after the four positioning blocks in the encoded graph have just been recognized, it is not known which is the first positioning block 11, which is the second positioning block 12, and which is the first positioning block 13, or which is the fourth positioning block 14, so it is still impossible to determine the direction of the encoded graph. In the subsequent process of Step 22, a quadrilateral is constructed by connecting the centers of the four positioning blocks. When the first positioning block 11, the second positioning block 12, the third positioning block 13, and the fourth positioning block 14 are determined based on the inner corners of the quadrilateral, the fourth positioning block 14 is first determined (the inner corner at the location of the fourth positioning block 14 is the largest inner corner of the quadrilateral), and then the third positioning block 13 and the second positioning block 12 are determined by judging the distances between the two positioning blocks adjacent to the fourth positioning block 14 in the quadrilateral and the fourth positioning block 14 (compared to the second positioning block 12, the third positioning block 13 is closer to the fourth positioning block 14), and finally, the remaining positioning block opposite to the fourth positioning block 14 in the quadrilateral is determined to be the first positioning block 11.

Based on this, the order reading encoded blocks in the encoded region can be determined. For example, the side where the first positioning block 11 and the second positioning block 12 are located can be positioned as top, and the side where the first positioning block 11 and the third positioning block 13 are located is positioned as left. When reading the encoded region, the encoded blocks of each row are read in the order from top to bottom, and each encoded block is read in the order from left to right in each row of encoded blocks.

It can be seen that the embodiment of the present application determines the direction of the encoded graph and the reading order of the encoded region by using the asymmetric distribution of the four positioning blocks.

The layout of the four positioning blocks in the embodiment of the present application adopts an asymmetric design, and after step 22, the relative positional relationship of the four positioning blocks is determined, that is the first positioning block 11, the second positioning block 12, the third positioning block 13 and the fourth positioning block 14 are determined, so that the direction of the encoded graph is determined by using the relative positional relationship among the first positioning block 11, the second positioning block 12, the third positioning block 13, and the fourth positioning block 14. In the subsequent steps, the direction of the encoded graph can be used to determine the reading order of each encoded block in the encoded region. It can be seen that, in the embodiment of the present application, the asymmetric distribution configuration of the four positioning blocks carries with itself direction information, and by using the asymmetric distribution configuration, the direction of the encoded graph can be determined, which can overcome the mirror image problem caused by a symmetric disposition and solve the problem that a direction of the encoded graph cannot be determined as a result of the mirror image problem. Therefore, the embodiment of the present application does not need to additionally adopt a mirror image detection step to determine the direction of the encoded graph.

In an optional embodiment, in step 23, determining a mapping relationship of the encoded graph from the image to a non-perspective distortion plane based on the four positioning blocks may comprise:

determining a mapping relationship of the encoded graph from the image to a non-perspective distortion plane, based on center coordinates of the first positioning block, the second positioning block, the third positioning block, and the fourth positioning block in the image, and center coordinates of the first positioning block, the second positioning block, the third positioning block, and the fourth positioning block in the non-perspective distortion plane.

In an optional embodiment, in a square plane region of the non-perspective distortion plane:

the first positioning block is located at a first corner region in the square plane region;

the second positioning block is located at a second corner region in the square plane region, and the second corner region and the first corner region are not located on a same diagonal line;

the third positioning block is located at a third corner region in the square plane region, and the third corner region and the second corner region are located on a same diagonal line;

the center of the first positioning block, the center of the second positioning block, the center of the third positioning block, and the center of a fourth positioning block form a quadrilateral; the position of the fourth positioning block is one of the fourth positioning block set that meets the following conditions:

the fourth positioning block is located in the square plane region, and in the above-mentioned quadrilateral, an inner corner at a location of the fourth positioning block is the largest inner corner of the quadrilateral, and a distance between the center of the fourth positioning block and the center of the third positioning block is smaller than a distance between the center of the fourth positioning block and the center of the second positioning block.

The distance between the center of the fourth positioning block and the center of the third positioning block is set as a first distance, and the distance between the center of the fourth positioning block and the center of the second positioning block is set as a second distance. The fourth positioning blocks with the first distance smaller than the second distance are put in a set. Optionally, in the square plane region of the non-perspective distortion plane, the positional relationship among the four positioning blocks should be consistent with the positional relationship among the four positioning blocks in the foregoing encoded graph embodiment of the present application. Optionally, the quadrilateral formed by the four positioning blocks in the square plane region of the non-perspective distortion plane is similar or identical to the quadrilateral formed by the four positioning blocks in the foregoing encoded graph embodiment of the present application.

In an optional embodiment, the center of the first positioning block, the center of the second positioning block, the center of the third positioning block, and the center of the fourth positioning block in the non-perspective distortion plane in step 23, can be arranged by the following steps:

step b1, placing a first target block in a first corner region of the square plane region of the non-perspective distortion plane;

step b2, placing a second target block in a second corner region of the square plane region;

step b3, placing a third target block in a third corner region on the same diagonal as the second corner region in the square plane region;

step b4, placing a fourth target block in the square plane region, so that in the quadrilateral formed by the center of the first target block, the center of the second target block, the center of the third target block, and the center of the fourth target block, the inner corner of the fourth target block is the largest inner corner of the quadrilateral, and the distance between the center of the fourth target block and the center of the third target block is less than the distance between the center of the fourth target block and the center of the second target block;

step b5, placing the center of the first target block to the center of the first positioning block in the non-perspective distortion plane, placing the center of the second target block to the center of the second positioning block in the non-perspective distortion plane, placing the center of the third target block to the center of the third positioning block in the non-perspective distortion plane, and placing the center of the fourth target block to the center of the fourth positioning block in the non-perspective distortion plane.

In the embodiment of the present application, the reading of the information recorded in the encoded region is finally performed in the encoded graph front view in the non-perspective distortion plane. Therefore, it is necessary to transform the captured encoded graph from the captured image to a non-perspective distortion plane. In this transformation, a target point of this transformation needs to be determined or set in advance and saved to ensure the smooth execution of subsequent graphic transformations. In the embodiment of the present application, after performing the above steps b1 to b5, the target points of the four positioning blocks for its respective transformation are determined in the square plane region. Therefore, no matter what angle the encoded graph is shot through, as long as the first positioning block, the second positioning block, the third positioning block, and the fourth positioning block can be identified and determined, a mapping relationship of the encoded graph from the image to the encoded graph front view can be determined by using the target points of the centers of each positioning blocks in the square plane region obtained and pre-stored in the steps b1 to b5 above, and image transformation can be performed.

In an optional embodiment, in step 23, determining a mapping relationship of the encoded graph from the image to a non-perspective distortion plane based on four positioning blocks, which may be obtained by the following steps:

step 231, determining a mapping relationship of the encoded graph from the image to a non-perspective distortion plane, based on center coordinate of the first positioning block, center coordinate of the second positioning block, center coordinate of the third positioning block, and center coordinate of the fourth positioning block in the image, and center coordinate of the first positioning block, center coordinate of the second positioning block, center coordinate of the third positioning block, and center coordinate of the fourth positioning block in the non-perspective distortion plane.

In an optional embodiment, in step 231, the determining a mapping relationship of the encoded graph from the image to a non-perspective distortion plane, based on center coordinate of the first positioning block, center coordinate of the second positioning block, center coordinate of the third positioning block, and center coordinate of the fourth positioning block in the image, and center coordinate of the first positioning block, center coordinate of the second positioning block, center coordinate of the third positioning block, and center coordinate of the fourth positioning block in the non-perspective distortion plane, may includes:

obtaining a homography matrix that characterizes the mapping relationship of the encoded graph from the image to the non-perspective distortion plane, based on coordinates of the first positioning block, center coordinate of the second positioning block, center coordinate of the third positioning block, and center coordinate of the fourth positioning block in the image, and center coordinate of the first positioning block, center coordinate of the second positioning block, center coordinate of the third positioning block, and center coordinate of the fourth positioning block in the non-perspective distortion plane.

In an optional embodiment, in step 23, the transforming the encoded graph in the image into the non-perspective distortion plane based on the mapping relationship to obtain an encoded graph front view includes:

step 232, transforming by projection of all pixel points of the encoded graph in the image to the non-perspective distortion plane using the homography matrix to obtain an encoded graph front view.

In an optional embodiment, in step 24, the encoded region is located in the encoded graph, and the encoded region is located in a region not occupied by the first positioning block, the second positioning block, the third positioning block or the fourth positioning block.

In an optional embodiment, in step 24, the reading an encoded region in which readable information is recorded in the encoded graph front view to obtain information recorded by the encoded graph may comprise:

step 241, in the four edges of the encoded graph in the encoded graph front view, taking the edge that is tangent to the first positioning block and the third positioning block at the same time as a first edge, taking the edge that is tangent to the first positioning block and the second positioning block at the same time as a second edge, taking the edge that is tangent to the second positioning block only as a third edge, and taking the edge that is tangent to the third positioning block and the fourth positioning block at the same time as a fourth edge;

step 242, taking a row of encoded blocks nearest to the second edge in the encoded region in which readable information is recorded in the encoded graph front view as a starting encoded row, taking a row of encoded blocks nearest to the fourth edge in the encoded region as a final encoded row, and in each row of encoded blocks, taking an encoded block nearest to the first edge as a starting encoded block and taking an encoded block nearest to the third edge as a final encoded block, and reading each encoded block in the order from the starting encoded row to the final encoded row and the order from the starting encoded block to the final encoded block in each encoded row, so as to obtain information recorded in the encoded graph.

Referring to FIGS. 3A and 3B, in an optional embodiment, each row of encoded blocks is read in sequence starting from the uppermost row of encoded blocks shown in FIGS. 3A and 3B, until the lowermost row of encoded blocks is read. In each row of encoded blocks, each encoded block is read in order from left to right.

In an optional embodiment, in step 242, when reading an encoded row interrupted by the fourth positioning block, the fourth positioning block is skipped to read encoded blocks in the encoded row.

In an optional embodiment, in step 24, after reading the encoded region, the method may further comprise:

step 243, performing error correction decoding on the information obtained by reading the encoded region to obtain an error-corrected codeword and an error number;

step 244, if the number of errors does not exceed an error correction capacity, outputting the error-corrected codeword.

In an optional embodiment, the error correction decoding algorithm used in step 243 may be an RS (Reed-Solomon) error correction decoding algorithm.

In an optional embodiment, before performing error correction decoding in step 243 and after obtaining the information recorded by the encoded graph in step 242, the method further includes:

performing bit XOR processing on the information obtained by reading the encoded region with a data mask matrix to obtain processed information.

In this case, step 243 may comprise: performing error correction decoding on the processed information to obtain an error-corrected codeword and an error number.

Regarding the bit XOR processing in the embodiment of the present application, supplementary explanation is as follows.

In the encoding process, bit XOR processing is performed on the real data to be recorded in the encoded region and a data mask matrix to obtain the encoded region graph that avoids black and white concentration; in the decoding process, bit XOR processing is performed on the encoded region graph and a data mask matrix as well to obtain a real data in the encoded region. The data mask matrix used in encoding is the same as the data mask matrix used in decoding, because the bit XOR processing follows the following associative law:

$$a \oplus (a \oplus b) = (a \oplus a) \oplus b$$

If a is defined as the data mask matrix, and b is defined as the real data to be recorded in the encoded region during encoding, the (a⊕b) on the left side of the above equation means performing bit XOR processing on the real data and the data mask matrix during encoding. If the result of (a⊕b) is defined as c, then c represents the encoded region graph which avoids black and white concentration. In this case, the content on the left side of the above equation is:

$$a \oplus (a \oplus b) = a \oplus c$$

a⊕c on the right side of the above equation indicates to perform bit XOR processing on the encoded region graph and the data mask matrix during decoding.

It can be seen from the above two equations that:

$$a \oplus c = a \oplus (a \oplus b) = (a \oplus a) \oplus b$$

Those skilled in the art know that the XOR value of a same value is zero, that is, in the above equation, a⊕a=0, then:

$$a \oplus c = a \oplus (a \oplus b) = (a \oplus a) \oplus b = 0 \oplus b$$

Those skilled in the art know that the result of XOR processing on zero and a non-zero number equals to the non-zero number, and if b is a non-zero number, then $$a \oplus c = a \oplus (a \oplus b) = (a \oplus a) \oplus b = 0 \oplus b$$

where, b is defined as the real data to be recorded in the encoded region during encoding. It can be seen from the above equation that during decoding, an original real data can be obtained by performing the bit XOR processing on the encoded region graph and the data mask matrix (the same as the data mask matrix used in encoding).

Therefore, in the encoding process and the decoding process, by using the same data mask matrix to perform bit XOR processing on the real data to be recorded in the encoding region and the encoded region graph, an original real data recorded in the encoded region can be obtained during decoding.

Figure 7:
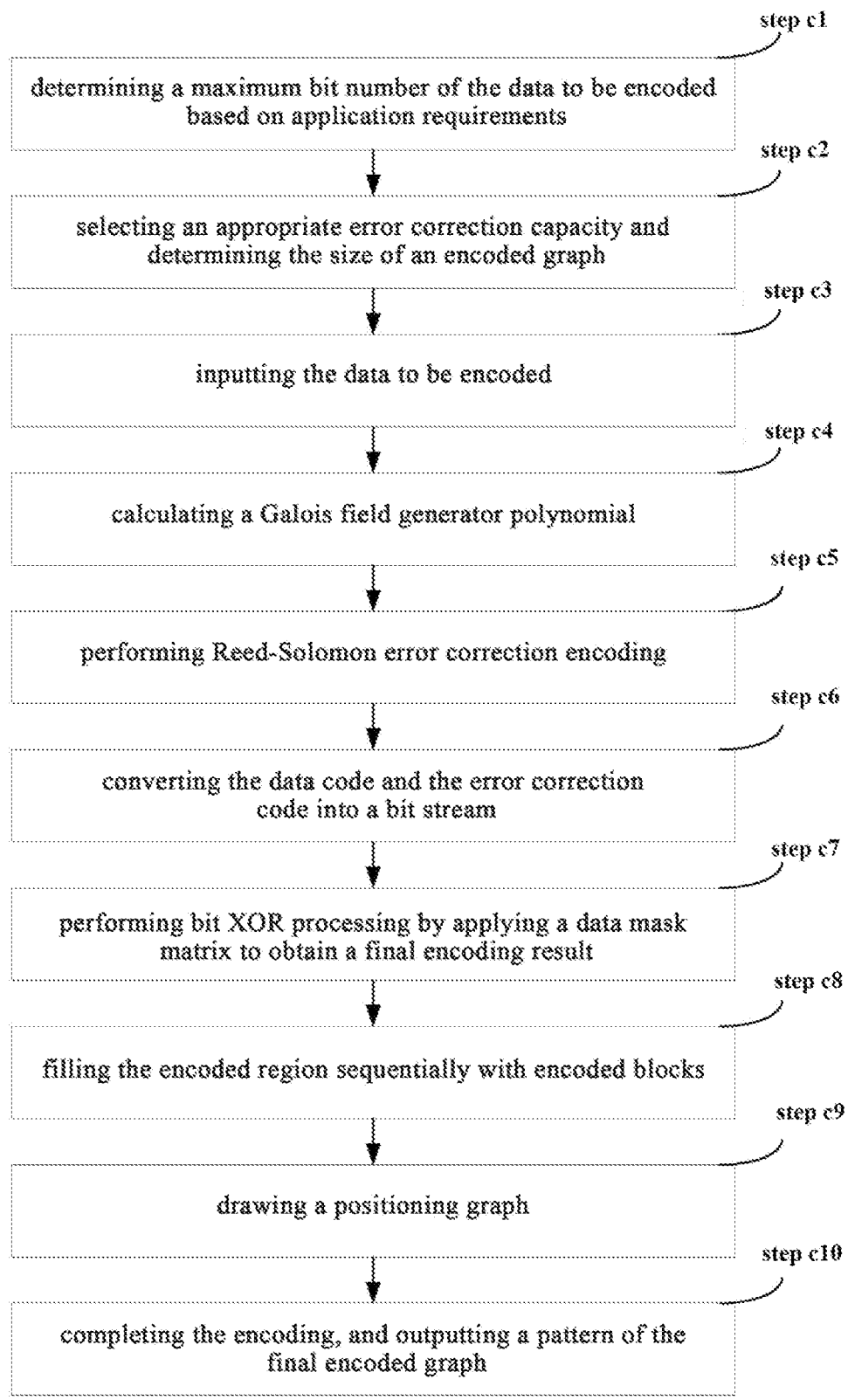
FIG. 7 is a flow chart of the entire process from the initial determination of data to be encoded to the final completion of encoding in an embodiment of the present application.

FIG. 7 shows an entire flow process from the initial determination of the data to be encoded to the final completion of encoding using the encoding method provided by embodiments of the present application. As shown in FIG. 7, the process includes:

step c1: determining a maximum number of bits of the data to be encoded based on application requirements.

In industrial application, different application scenarios have different requirements for data capacity in an encoded graph. In an optional embodiment, the encoded graph formed by using the encoding method of an encoded graph provided in the embodiments of the present application has a function of assisting positioning. Data stored in the encoded graph are generally a set of decimal numbers representing a location coordinate. The location coordinate can be represented jointly by a row and column index and a unit distance, and can also be represented by actual physical coordinates. Before making an encoded graph, the maximum decimal bit number needed to represent a location coordinate needs to be defined first.

Step c2: selecting an appropriate error correction capacity and determining the size of an encoded graph.

In the same way as the error correction capacity of a conventional two-dimensional code, the error correction capacity here refers to the number of erroneous codewords that can be corrected by a decoder when a codeword (an encoded block in an encoded region) is changed due to the impact of illumination, distortion, image notice, etc. on an encoded graph (a two-dimensional code). The error correction capacity reflects the anti-noise performance of an encoded graph.

In an industrial application, different scenarios have different requirements for the error correction capacity of an encoded graph. In some scenarios, the imaging environment can be relatively well controlled and the probability that an error occurs with an encoded graph is relatively low, in which case the requirement for the error correction capacity is relatively low. In some other scenarios, the imaging environment is complicated and varies a lot and the probability that an error occurs with an encoded graph is relatively high, in which case the requirement for the error correction capacity is relatively high. In a situation where the requirement for the error correction capacity is relatively high, more error correction codes are needed, so as to ensure decoding performance Before generating an encoded graph, the required error correction capacity t needs to be assessed based on properties of the utilization environment of the encoded graph. The side length a of an encoded graph can be calculated based on the number of data codes k and the number of error correction codes 2t:

$$a = \text{ceil}(2\sqrt{m^2 + 2k + 4t})$$

where, m is the side length of the region occupied by a positioning block, which can also be referred to as the size of the positioning block or the diameter of the positioning block. The number of data codes can also be referred to as the maximum number of bits of the data to be encoded, the number of error correction codes can also be referred to as the number of bits of the error correction capacity, and m, k, and t are all expressed using the side length of one encoded block as an elemental unit. The side length of an encoded graph a is actually a times the side length of the encoded block. In the encoded graph as shown in the embodiments shown in FIGS. 3A and 3B, m represents the diameter of the outermost circular ring of a positioning block, and ceil(x) represents finding the smallest integer that is not smaller than x.

If the bit number q of the static region surrounding the encoded graph is taken into consideration, q being expressed using the side length of one encoded block as the elemental unit, then:

$$a' = \text{ceil}(2\sqrt{m^2 + 2k + 4t}) + 2q$$

Here, a' is actually a' times the side length of the encoded blocks.

Step c3: inputting the data to be encoded.

Step c4: calculating a Galois field generator polynomial g(x), where, the Galois field base is 2, and x denotes data codes. A generator polynomial represents the product of 2t first-degree polynomials, 2t denotes a preset number of bits of the error correction capacity.

$$g(x) = \prod_{i=0}^{2t-1}(x - 2^i)$$

Step c5: performing RS error correction encoding. Supposing a data code polynomial is:

$$d(x) = \sum_{i=0}^{k-1} d_i x^i$$

where, $d_i$ is a preset coefficient of the i bit of the data code, and x denotes the data code. Then, the error correction polynomial is the remainder obtained by dividing $x^{2t}d(x)$ by the polynominal g(x). The error correction code is placed after the data code, as shown in FIG. 5, to obtain an encoded data, and thus the error correction encoding is complete. Alternatively, the error correction code can be placed before the data code to obtain the encoded data, and thus the error correction encoding is complete.

Step c6: converting the data code and the error correction code into a bit stream. The minimal unit in an encoded region is an encoded block, encoded blocks of different colors represent different information, wherein, black represents 0, and white represents 1; or, white represents 0, and black represents 1. In the step c6, decimal codewords are converted into a binary bit stream to realize encoding. When converting decimal codewords into a binary bit stream, every two-bit decimal codewords are grouped into one group, each group of decimal codewords are converted into one group of binary codewords. After all the groups of decimal codewords are converted, the corresponding respective groups of binary codewords are spliced together based on the relative order of the respective groups of decimal codewords to form a binary bit stream.

Step c7: performing bit XOR processing by applying a data mask matrix to obtain a final encoding result. In order to prevent the aggregation of encoded blocks of the same color in the encoded region, a data mask matrix with alternating 0 and 1 is applied to the encoded region. The formula of the data mask matrix is:

mask=(row+col) %2 where, row is the row number of an encoded block, col is the column number of an encoded block, and mask is a mask value. XOR processing is performed on the mask and the value of an encoded block at the corresponding location to obtain a final encoding result.

Step c8: filling the encoded region sequentially with encoded blocks contained in the final encoding result. As shown in FIG. 3A and FIG. 3B, when filling in encoded blocks, the encoded region is filled with encoded blocks sequentially in the order of from left to right and from top to bottom by starting from the location of the first encoded block at the left upper corner of the encoded region (i.e., the encoded block adjacent to the first positioning block 11 and the second edge 17). When filling in encoded blocks of each row interrupted by the fourth positioning block 14, encoded blocks of that row on the left side of the fourth positioning block 14 are first filled in from left to right, then the fourth positioning block 14 is skipped, and encoded blocks of that row on the right side of the fourth positioning block 14 continue to be filled in, until all encoded blocks are filled in.

Step c9: drawing a positioning graph. In this step, the positioning graph is a positioning block.

In an optional embodiment, the circular ring form shown in FIG. 3A and FIG. 3B is used for a positioning block. In a positioning block, the widths of a color band of black and white circular rings are the same, a black circular ring being at the outermost, a white circular ring being at the innermost.

In an optional embodiment, the radius of an inner white circular ring is ⅜ of the radius of an outer black circular ring. In another optional embodiment, the inner white circular ring and the outer black circular ring can also adopt another radius ratio.

Step c10: completing the encoding, and outputting a pattern of the final encoded graph.

Figure 8:
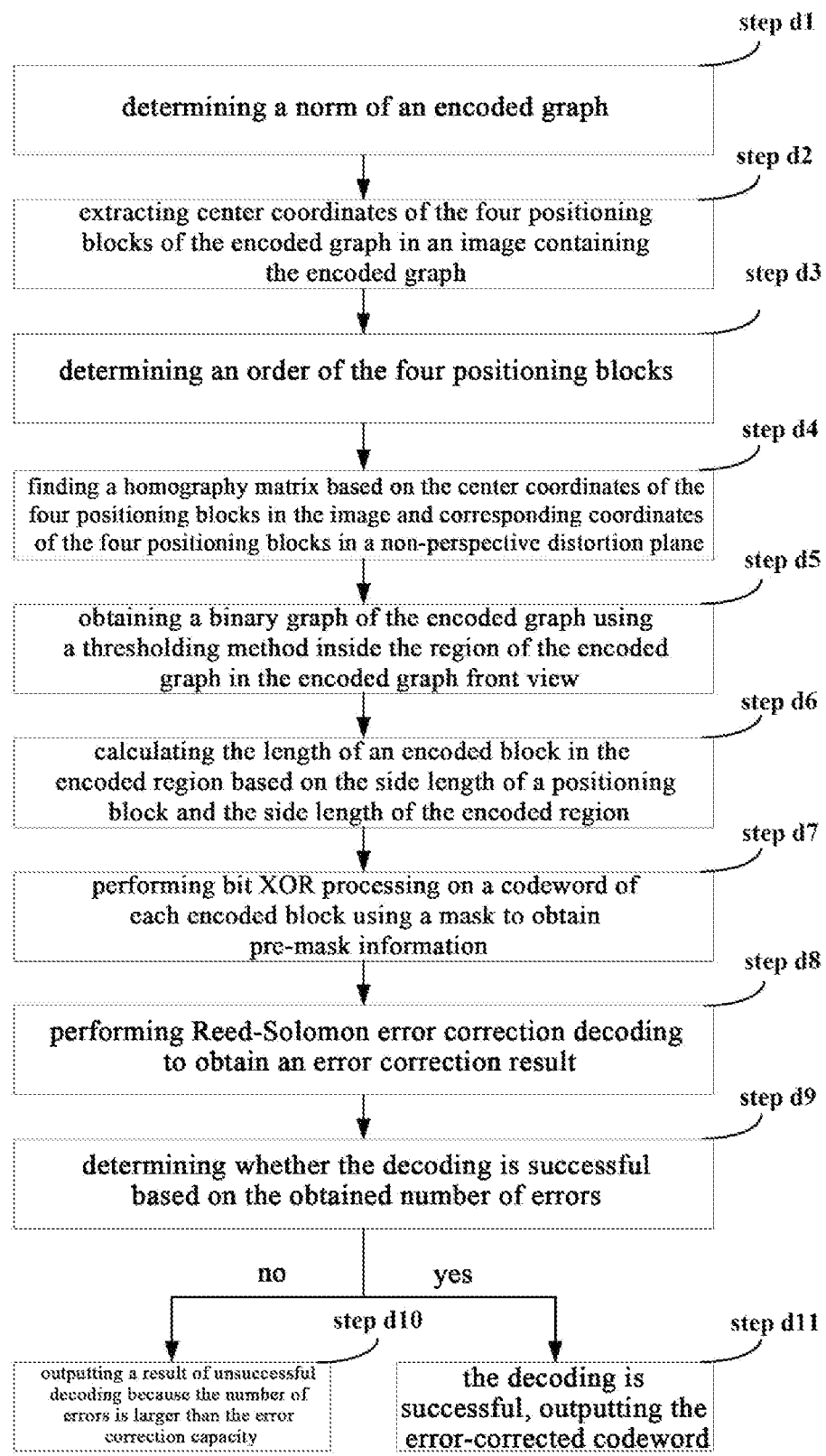
FIG. 8 is a flowchart of the entire process from determining a norm of an encoded graph to finally completing the decoding in an embodiment of the present application.

FIG. 8 shows the entire flow process from determining a norm of an encoded graph to finally completing the decoding by using the method for reading an encoded graph provided by embodiments of the present application. As shown in FIG. 8, the process includes:

step d1: determining a norm of an encoded graph. During decoding, decoding needs to be performed based on a norm of an encoded graph during encoding. The norm mainly includes: the number of data codes, the number of error correction codes, the size of a positioning block, etc.

Step d2: extracting center coordinate of the four positioning blocks of the encoded graph in an image containing the encoded graph.

With respect to the four positioning blocks in the embodiments shown in FIG. 3A and FIG. 3B, in an optional embodiment, a search is made for positioning blocks of the four circular rings shown in FIG. 3A and FIG. 3B using a Hough Transform algorithm, and thus, center coordinate of each positioning block in the image containing the encoded graph is determined using the number of concentric circles and radius relationship in each positioning block. In this embodiment, a Hough Transform algorithm is an existing algorithm, and an existing technology can be used to realize the determination of center coordinate of concentric circles using the number of concentric circles and radius relationship in each positioning block, which is not described here.

Step d3: determining an order of the four positioning blocks.

In this step, determining an order of the four positioning blocks consists in determining the first positioning block, the second positioning block, the third positioning block, and the fourth positioning block in the four positioning blocks.

In this step, the first positioning block, the second positioning block, the third positioning block, and the fourth positioning block are determined using the asymmetry of the locations of the four positioning blocks. In reference to the embodiments shown in FIG. 3A and FIG. 3B, in a quadrilateral formed by the four positioning blocks, the angel formed by the two adjacent sides of the positioning block at the right lower corner is the largest inner corner of the quadrilateral. The inner corners of the four positioning blocks in the quadrangle are respectively obtained. The positioning block at the position of the maximum inner corner (the right lower corner of the quadrangle) is determined as the fourth positioning block, the positioning block nearest to the fourth positioning block among positioning blocks connected by two sides of the largest inner corner is determined as the third positioning block (the positioning block at the left lower corner of the quadrilateral), the positioning block furthest from the fourth positioning block among positioning blocks connected by the two sides of the largest inner corner that is is determined as the second positioning block (the positioning block at the right upper corner of the quadrilateral), and the remaining positioning block is determined as the first positioning block (the positioning block at the left upper corner of the quadrilateral).

Step d4: finding a homography matrix based on the center coordinates of the four positioning blocks in the image and the center coordinates of the four positioning blocks in a non-perspective distortion plane. All pixel points in the region of the encoded graph in the image are mapped to the non-perspective distortion plane using the homography matrix to obtain an encoded graph image with perspective distortion removed, i.e., an encoded graph front view.

Step d5: obtaining a binary graph of the encoded graph using a thresholding method inside the region of the encoded graph in the encoded graph front view.

Step d6: calculating the length of an encoded block in the encoded region based on the side length of a positioning block and the side length of the encoded region. Meshing is performed in the encoded region using the length of the encoded block as a step, and the bit value of each mesh is read. In reality, a judging threshold value T can be set based on needs. When the number of white pixels in a mesh exceeds T, then it is judged that the mesh is a white encoded block; otherwise, it is judged that the mesh is a black encoded block. As shown in FIG. 3A and FIG. 3B, each encoded block is read sequentially, starting from an encoded block immediately adjacent to the first positioning block 11 and the second edge 17, in the order at the time of encoding (i.e., each row of encoded blocks is read sequentially from left to right and from top to bottom), until all encoded blocks are read.

Step d7: performing bit XOR processing on a codeword of each encoded block using a mask to obtain pre-mask information. In this step, the mask can be understood as a data mask matrix.

Step d8: performing RS error correction decoding to obtain an error correction result.

The result of the error correction contains an error-corrected codeword and an error number.

Step d9: determining whether the decoding is successful based on the number of errors obtained by the calculation in step d8. If the number of errors exceeds the error correction capacity, then error correction decoding cannot be completed, and step d10 is executed; otherweise, it means that the decoding is successful, and step d11 is executed.

Step d10: outputting a result of unsuccessful decoding because the number of errors is larger than the error correction capacity.

Step d11: the decoding is successful, outputting the error-corrected codeword.

Figure 9:
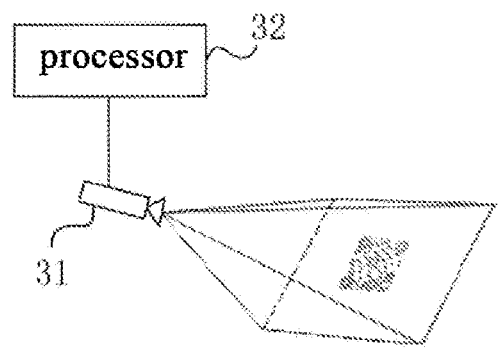
FIG. 9 is a schematic diagram of a capturing apparatus provided by an embodiment of the present application.

Embodiments of the present application further provide a capturing device. As shown in FIG. 9, the capturing device includes a capturing unit 31 and a processor 32. In this embodiment, the capturing unit 31 is used for photographing an object surface containing an encoded graph to obtain an image containing the encoded graph. The processor 32 is used for: recognizing four positioning blocks in the image containing the encoded graph; determining a mapping relationship of the encoded graph from an image to a non-perspective distortion plane based on the four positioning blocks, and transforming the encoded graph in the image into the non-perspective distortion plane based on the mapping relationship to obtain an encoded graph front view; reading an encoded region in which readable information is recorded in the encoded graph front view to obtain information recorded by the encoded graph;

wherein, centers of the four positioning blocks form a quadrilateral, and the step of recognizing four positioning blocks in the encoded graph in the image includes:

determining a positioning block at the largest inner corner of the quadrilateral as a fourth positioning block, determining a positioning block nearest to the fourth positioning block as a third positioning block, determining a positioning block furthest from the fourth positioning block as a second positioning block, and determining the remaining positioning block as a first positioning block.

Embodiments of the present application further provide a non-volatile computer readable storage medium storing instructions that, when executed by a processor, cause the processor to execute steps in the encoding method of an encoded graph as described in any of the above embodiments.

Embodiments of the present application further provide a non-volatile computer readable storage medium storing instructions that, when executed by a processor, cause the processor to execute steps in the method for reading an encoded graph as described in any of the above embodiments.

Embodiments of the present application further provide a computer program, the computer program, when being executed by a processor, causes the processor to execute steps in the encoding method as described in any of the above embodiments.

Embodiments of the present application further provide a computer program, the computer program, when being executed by a processor, causes the processor to execute steps in the method for reading an encoded graph as described in any of the above embodiments.

Embodiments of the present application further provide an electronic device (for its structure, one can refer to FIG. 17), including: at least one processor 41; and, a memory 42 communicatively connected to the at least one processor 41; wherein, the memory 42 stores instructions that can be executed by the at least one processor 41, the instructions being executed by the at least one processor 41, so as to cause the at least one processor 41 to execute steps in the encoding method of an encoded graph as described in any of the above embodiments.

Embodiments of the present application further provide an electronic device (for its structure, one can also refer to FIG. 17), including: at least one processor 41; and, a memory 42 communicatively connected to the at least one processor 41; wherein, the memory 42 stores instructions that can be executed by the at least one processor 41, the instructions being executed by the at least one processor 41, so as to cause the at least one processor 41 to execute steps in the method for reading an encoded graph as described in any of the above embodiments.

The technical solution of embodiments of the present application replaces two-dimensional code standards in the relevant art, which saves the authorization cost and manufacturing cost needed when using a two-dimensional code generating software in the relevant art, and is not limited to the utilization limit of a two-dimensional code generating software in the relevant art.

In addition, in embodiments of the present application, three of the four positioning blocks are located respectively at three corners of the encoded graph, while the other positioning block is only tangential to an edge of the encoded graph. The four positioning blocks form an asymmetric distribution configuration. Thus, embodiments of the present application achieves accurate and rapid positioning of the encoded graph using this asymmetric distribution configuration, thereby ensuring accurate reading of the encoded region. At the same time, embodiments of the present application set a direction of the encoded graph by using the four positioning blocks of the asymmetric distribution configuration, which facilitates rapidly finding the location of a starting encoded block in the encoded region, and achieves accurate and rapid reading of information recorded in the encoded region by reading each row of encoded blocks sequentially in the order of from top to bottom and from left to right.

In addition, in embodiments of the present application, the asymmetric distribution configuration of the four positioning blocks carries with itself direction information, and by using the asymmetric distribution configuration, a direction of the encoded graph can be determined, which can overcome the mirror image problem created by a symmetric disposition and solve the problem that a direction of the encoded graph cannot be determined as a result of the mirror image problem. Thus, when reading data in two, positive and negative, directions of the encoded graph, the direction of the encoded graph can be recognized and thus an objective of reading data of the same encoded graph in two, positive and negative, directions can be achieved, thereby increasing the range of application of the encoded graph.

Embodiments of the present application can set the size of the encoded graph and the size of the encoded region in the encoded graph based on the quantity of data of an application scenario, so as to flexibly provide data information recorded in the encoded graph. In embodiments of the present application, the RS error correction mechanism is used to make the encoded region have error correction performance, which can correct the error code that does not exceed the error correction capacity. The approach of encoding the encoded region in the embodiments of the present application is simple and improves encoding efficiency, especially with more prominent results for scenarios that have a relatively small data quantity of encoded data.

The encoded graph in the embodiments of the present application can be formed at a calibration board, so as to assist positioning of the calibration board in the course of calibrating a camera. The encoded region of the encoded graph can record a coordinate of a marking point of the encoded graph (such as an index coordinate or a physical coordinate) and/or relevation information of the calibration board (such as a physical distance between feature points in the calibration board). Here, the marking point is a feature point.

Figure 10:
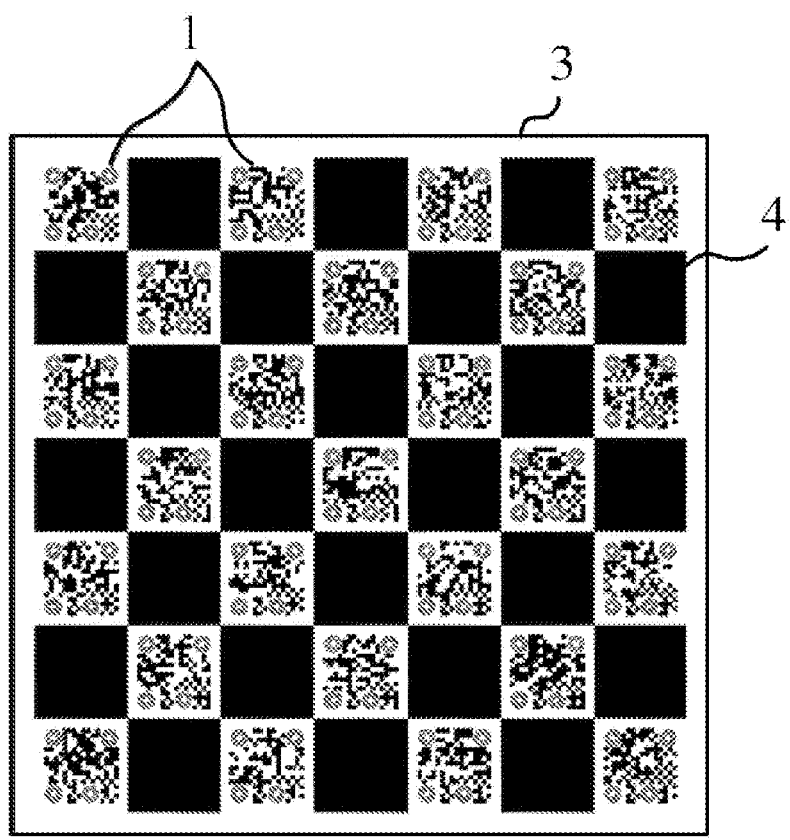
FIG. 10 is a schematic diagram of a calibration board provided by an embodiment of this application.
Figure 11:
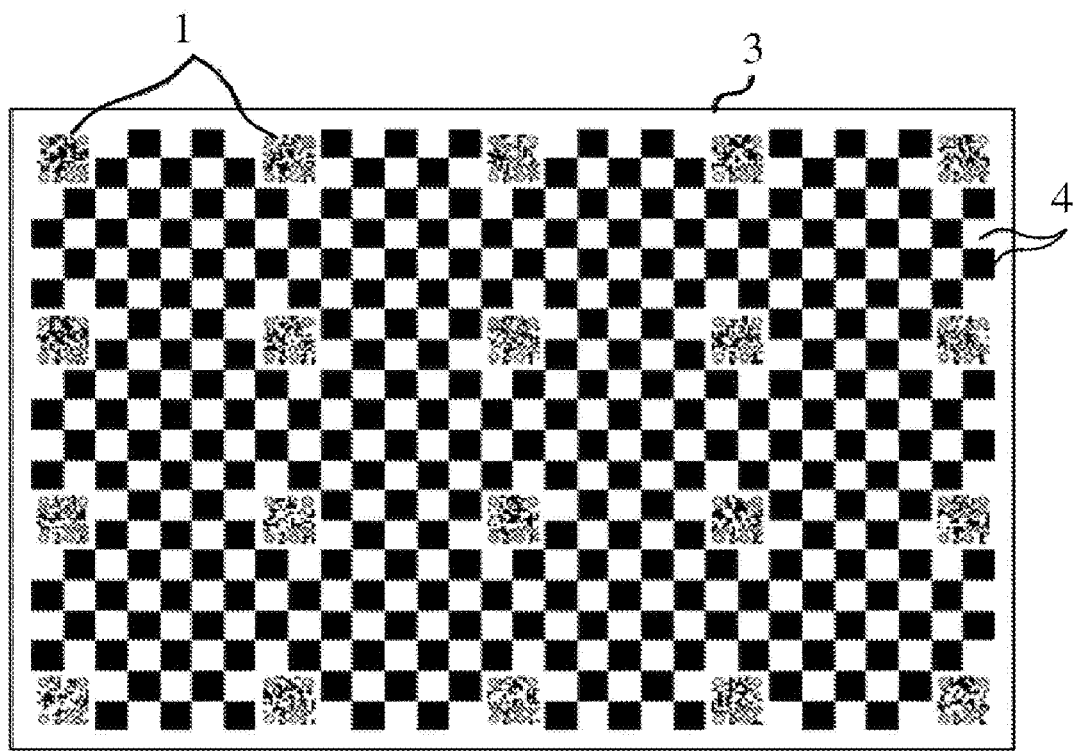
FIG. 11 is another schematic diagram of a calibration board provided by an embodiment of the present application.

FIG. 10 shows a schematic diagram of a calibration board provided by the embodiments of the present application, and FIG. 11 shows another schematic diagram of a calibration board provided by the embodiments of the present application. In the embodiments of the present application, the encoded graph in a calibration board is as shown in FIGS. 3A and 3B.

As shown in FIG. 10 and FIG. 11, the calibration board provided by the embodiments of the present application includes a substrate 3, a feature pattern 4, and an encoded graph 1. The feature pattern 4 is printed on a surface of the substrate 3, and there are a plurality of feature points in the feature pattern 4. The encoded graph 1 is square and covers the feature pattern 4.

In this embodiment, as shown in FIG. 3A and FIG. 3B, the encoded graph 1 includes a first positioning block 11, a second positioning block 12, a third positioning block 13, a fourth positioning block 14, and an encoded region 15. Please refer to the description of FIG. 3A and FIG. 3B for the specific structure of the encoded graph 1 and the reading of information recorded in the encoded region 15, which are not described again.

Calibration information of a marking point of the encoded graph 1 is recorded in the encoded region 15 of the calibration board, wherein, the marking point coincides with one of the feature points in the feature pattern 4. It can be understood that the marking point is a feature point.

In the embodiments of the present application, the relative position relationship of the first positioning block 11, the second positioning block 12, the third positioning block 13, and the fourth positioning block 14 reflects a direction of the encoded graph 1. When it is determined that, among the four positioning blocks, which is the first positioning block 11, which is the second positioning block 12, which is the third positioning block 13, and which is the fourth positioning block 14, the direction of the encoded graph 1 can be determined.

In the embodiments of the present application, the encoded graph 1 is designed as a square, so that the distance between the first positioning block 11 and the second positioning block 12 is the same as the distance between the first positioning block 11 and the third positioning block 13, and thus it can be quickly determined which is the first positioning block 11 and which is the fourth positioning block 14. Through the fourth positioning block 14, it can be quickly determined which is the third positioning block 13 and which is the second positioning block 12. In the embodiments of the present application, an advantage of designing the encoded graph 1 as a square is that the direction of the encoded graph 1 can to be determined rapidly through the relative position relationship of the four positioning blocks.

Of course, the encoded graph 1 can also be designed to be a rectangle with a length and a width that are different from each other. In this situation, it cannot be determined which is the first positioning block 11 by determining whether the distance between the first positioning block 11 and the second positioning block 12 is equal to the distance between the first positioning block 11 and the third positioning block 13. Thus, another way needs to be used to determine which the first positioning block 11 is. For example, design rules to stipulate that the distance between the first positioning block 11 and the second positioning block 12 and the distance between the first positioning block 11 and the third positioning block 13 meet a certain ratio relationship, and this ratio relationship must also be different from the ratio relationships between other adjacent sides in the quadrilateral formed by the first positioning block 11, the second positioning block 12, the third positioning block 13, and the fourth positioning block 14. In addition, it needs to be stipulated also that a line connecting the first positioning block 11 and the third positioning block 13 is perpendicular to a line connecting the first positioning block 11 and the second positioning block 12. For a device to be calibrated, when there is a lens, it is very difficult to determine whether the line connecting the first positioning block 11 and the third positioning block 13 is perpendicular to the line connecting the first positioning block 11 and the second positioning block 12. Therefore, an ideal shape of the encoded graph 1 should be a square, which is necessary for determining a direction of the encoded graph 1 in reference to the relative position of the four positioning blocks.

In an optional embodiment, by positioning the direction on the side of the second edge 17 as top, the direction on the side of the first edge 16 as left, the direction of the side of the third edge 18 as right, and the direction of the side of the fourth edge 19 as bottom, a direction of the encoded graph 1 can be determined, and the direction of the encoded graph 1 can be determined based on the four positioning blocks. Furthermore, since the encoded graph 1 is fixed relative to the feature pattern 4 and the calibration board, a direction of the calibration board can also be determined based on the four positioning blocks. Therefore, in the embodiments of the present application, the four positioning blocks in the encoded graph 1 can provide not only direction information of the encoded graph 1, but also direction information of the calibration board, which realizes the multiplexing of marking the direction of the encoded graph and the direction of the calibration board.

In an optional embodiment, a feature point that one specified vertex corner of four vertex corners of the encoded graph 1 (i.e., the left upper corner, the right upper corner, the left lower corner, and the right lower corner of the encoded graph 1 as shown in FIG. 3A and FIG. 3B) points to and is nearest to the specified vertex corner can be taken as the marking point of the encoded graph 1.

In an optional embodiment, the encoded graph 1 further includes a static region 2. The first positioning block 11, the second positioning block 12, the third positioning block 13, the fourth positioning block 14, and the encoded region 15 are embedded in the static region 2. The static region 2 is used for isolating the feature pattern 4 from the pattern embedded in the static region 2. The pattern embedded in the static region 2 is the encoded graph 1, including the first positioning block 11, the second positioning block 12, the third positioning block 13, the fourth positioning block 14, and the encoded region 15. Thus, one can avoid being unable to accurately read the first positioning block 11, the second positioning block 12, the third positioning block 13, the fourth positioning block 14, or the encoded region 15 due to them being connected with the feature pattern 4. In this embodiment, the static region 2 is referenced in FIG. 3A and FIG. 3B.

Figure 12:
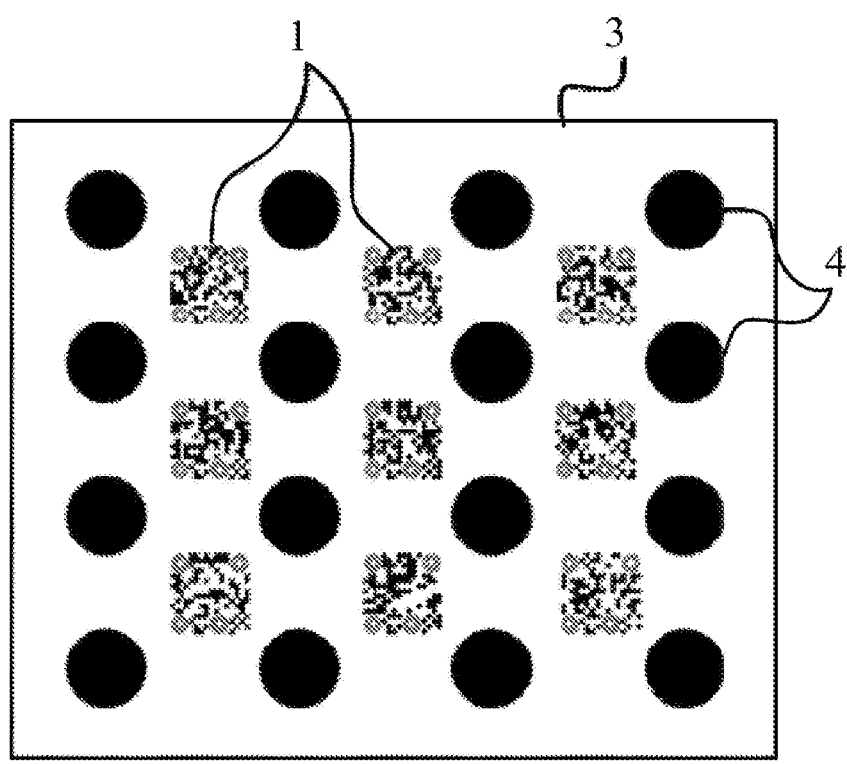
FIG. 12 is still another schematic diagram of a calibration board provided by an embodiment of the present application.

In an optional embodiment, the feature pattern 4 is a checkerboard pattern (as shown in FIG. 10 and FIG. 11), a dot pattern (as shown in FIG. 12), a hexagonal pattern, or another pattern. In this embodiment, as shown in FIG. 12, dot feature pattern 4 is arranged in the form of a matrix, and the encoded graph 1 is embedded between the dot feature patterns 4. Even though the accompanying drawings do not illustrate a hexagonal pattern or another pattern, under the principle of embodiments of the present application, the contents of the embodiments shown in FIG. 10, FIG. 11, and FIG. 12 can be expanded to a hexagonal pattern or another pattern. When the feature pattern 4 is a checkerboard pattern, the feature points are corner points of each checkerboard. When the feature pattern 4 is a dot pattern, the feature points are center points of each dot. When the feature pattern 4 is a hexagonal pattern, the feature points are corner points of each hexagon.

In an embodiment of the present application, the feature pattern 4 is composed of a plurality of elemental feature unit patterns that have the same size and are arranged with equal interval. In the checkerboard pattern as shown in FIG. 10 and FIG. 11, the elemental feature unit patterns are elemental squares in black and in white (i.e., checkerboard), all checkboards in black and in white have the same size and arranged with equal interval, and both black checkerboards and white checkerboards are elemental feature unit patterns.

As shown in FIG. 12, all dots have the same size and are arranged with equal interval. In the embodiments of the present application, in the embodiment shown in FIG. 10, the size of the encoded graph 1 is equal to the size of a white checkerboard and the encoded graph 1 covers exactly an elemental feature unit pattern of the white checkerboard.

In an optional embodiment, the number of the encoded graph 1 in the calibration board is at least one, and the encoded region 15 in each encoded graph 1 records calibration information of a marking point of the encoded graph 1 used for determining a location coordinate of a feature point in the calibration board. In other words, the encoded region 15 of each encoded graph 1 records respectively calibration information of its own marking point. For a calibration board that uses only one encoded graph 1, it is suitable for calibrating a single camera, while for a calibration board that uses more than one encoded graph 1, it can provide information about correlation information between a plurality of cameras and thus can be suitable for calibrating a plurality of cameras.

In an optional embodiment, the feature pattern of the calibration board is a checkerboard pattern, the elemental feature unit pattern is a checkboard, and the encoded graph 1 (together with the static region 2 surrounding the encoded graph 1) occupies at least one checkboard. For example, as shown in FIG. 10, the size of the encoded graph 1 is equal to the size of a white checkboard, and each encoded graph 1 occupies one white checkboard. In this situation, the marking point of the encoded graph 1 can be one of its corner point at the left upper corner, corner point at the right upper corner, corner point at the left lower corner, or corner point at the right lower corner. As shown in FIG. 11, the size of the encoded graph 1 is larger than the size of an elemental feature unit pattern (a checkboard). Specifically, the side length of the encoded graph 1 is twice the side length of the checkboard, the area of the encoded graph 1 is four times the area of a checkboard, and each encoded graph 1 occupies four checkboards, i.e., each encoded graph 1 occupies two black checkboards and 2 white checkboards. In this situation, the marking point of the encoded graph 1 can be one of its corner point at the left upper corner, corner point at the right upper corner, corner point at the left lower corner, or corner point at the right lower corner. In addition, a coordinate of the center point of the encoded graph 1 can be estimated by means of a homography matrix. In this situation, the marking point of the encoded graph 1 can also be its center point.

In an optional embodiment, the marking point of the encoded graph 1 can be the corner point at the left upper corner, corner point at the right upper corner, corner point at the left lower corner, or corner point at the right lower corner of the encoded graph 1 in the feature pattern 4. In this situation, the size or area of the encoded graph 1 and the surrounding static region 2 may not have to exactly match an elemental feature unit pattern, as long as at least one of the corner point at the left upper corner, the corner point at the right upper corner, the corner point at the left lower corner, and the corner point at the right lower corner of the encoded graph 1 can coincide with a feature point in the feature pattern 4. Thus, the side length of the encoded graph 1 can be smaller than the side length of an elemental feature unit pattern, and can also be larger than the side length of an elemental feature unit pattern, and the side length of the encoded graph 1 may not be an integer multiple of the side length of an elemental feature unit pattern.

When using the calibration board of the embodiments of the present application to perform calibration, the specific point location of the marking point of the encoded graph 1 can be stipulated according to actual needs.

As described above, the calibration information of the marking point of the encoded graph 1 is recorded in the encoded region 15, and the marking point coincides with one of the features points in the feature pattern 4. Therefore, the calibration information recorded in the encoded region 15 is calibration information of the feature point, which can be used for determining a location coordinate of the feature point in the calibration board.

In an optional embodiment, the calibration information of the marking point of the encoded graph 1 (which is also the calibration information of the feature point) includes: a calibration indexing coordinate of the marking point of the encoded graph 1 in all the feature points of the calibration board, and a physical distance between adjacent feature points in the calibration board. In this embodiment, the calibration indexing coordinate means: an indexing coordinate of the marking point recorded in the encoded region 15 in all the feature points of the calibration board.

In another optional embodiment, the calibration information of the marking point of the encoded graph 1 includes: a physical coordinate of the marking point of the encoded graph 1 in the calibration board.

In an optional embodiment, if the calibration information of the marking point of the encoded graph 1 includes: a calibration indexing coordinate of the marking point of the encoded graph 1 in all the feature points of the calibration board, and a physical distance between adjacent feature points in the calibration board, then during calibration, a specific location (such as a row number and a column number) of the marking point in all the feature points can be obtained by means of the calibration indexing coordinate of the marking point recorded in the encoded graph 1 in all the feature points of the calibration board. Thus, using the specific location of the marking point in all the feature points as a basis, an indexing coordinate of all the feature points in the calibration board can be obtained; and in combination of the physical distance between adjacent feature points in the calibration board and the indexing coordinates of all the feature points, physical coordinates of all the feature points in the calibration board can be obtained.

In an optional embodiment, if the calibration information of the marking point of the encoded graph 1 includes: a physical coordinate of the marking point of the encoded graph 1 in the calibration board, then before calibration, a physical distance between adjacent feature points in the calibration board is inputted manually to a device to be calibrated (such as a camera). During calibration, by means of the physical coordinate of the marking point in the calibration board recorded in the encoded graph 1, a physical coordinate of all the feature points in the calibration board can be obtained by combining the physical coordinate of the marking point in the calibration board and the physical distance between adjacent feature points in the calibration board.

In fact, any representation method used for indicating the location of a feature point other than the above optional embodiments can be used under the principle of the embodiments of the present application as long as the data capacity that can be recorded in the encoded region 15 is not exceeded.

In an optional embodiment, in the encoded region 15, a point matrix composed of data points includes a data points, the a data points being arranged to form b data codewords and c error correction codewords, each codeword being a binary d bit, in which the calibration information of the marking point is recorded in the b data codewords, and the error correction codewords are used for performing error correction decoding on the b data codewords, wherein, $a>1$, $b>1$, $c>b$, $d>1$, and $a=(b+c)\times d$. For example, as shown in FIG. 3A and FIG. 3B, in the encoded region 15, a data point matrix includes 192 data points, and the entire encoded graph 1 occupies a location of $16\times16=256$ data points, in which each positioning block occupies respectively a location of $4\times4=16$ data points, and four positioning blocks occupy in total a location of 64 data points, and the 192 data points are determined by a location of 192 data points by subtracting the location of 64 data points occupied by the four positioning blocks from the location of 256 data points of the entire encoded graph 1. There is a data point at the location of each data point in the location of the 192 data points. The 192 data points are arranged to form 6 data codewords and 18 error correction codewords, each codeword being a binary 8-bit, i.e., $192=(6+18)\times8$. In this embodiment, the calibration information of the marking point is recorded in the 6 data codewords, and the error correction codewords are used for performing error correction decoding on the data codewords. In reality, the error correction codewords are used for correcting any erroneous codeword up to an error correction capacity, and the erroneous codeword may be a data codeword and may also be an error correction codeword itself. Therefore, in an optional embodiment, the error correction codewords are used for performing error correction decoding on all codewords containing data codewords and the error correction codewords themselves.

In an optional embodiment, when the calibration information of the marking point of the encoded graph 1 includes a calibration indexing coordinate of the marking point of the encoded graph 1 in all the feature points of the calibration board and a physical distance between adjacent feature points in the calibration board, the contents of the b data codewords after they are convered to be decimal contain: a column number and a row number of the marking point of the encoded graph 1 in all the feature points, and a physical distance between adjacent feature points in the calibration board.

For example, in the case where the calibration information of the marking point includes a calibration indexing coordinate of the marking point of the encoded graph 1 in all the feature points of the calibration board and a physical distance between adjacent feature points in the calibration board, a scheme for encoding the encoded region 15 is as follows:

6 data codewords after being converted to be decimal are expressed in the format of XXYYZZZZZZZZ. In this embodiment, XXYY is an indexing coordinate of the marking point of the encoded graph 1 of an encoded graph unit 3 to which the encoded region 15 belongs in all the feature points of the calibration board, in which XX represents a column number of the marking point of the encoded graph 1 to which the encoded region 15 belongs in all feature points, and YY represents a row number of the marking point of the encoded graph 1 to which the encoded region 15 belongs in all feature points. XX and YY are in the range of 0 to 99 in value, wherein, 0 and 99 are decimal values. ZZZZZZZZ represents a physical distance between adjacent feature points in the calibration board and is in the range of 0 to 99999999 in value, representing a physical size range of 0 to 9.9999999 meter. which can encompass the checkerboard size range of calibration boards commonly used in the industry.

In other optional embodiments, another encoding scheme may also be used for the encoded region 15. For example, for the case where the calibration information of the marking point includes a physical coordinate of the marking point of the encoded graph 1 in the calibration board, the physical coordinate of the marking point of the encoded graph 1 in the calibration board can be recorded in 6 data codewords.

As described above, in the embodiments of the present application, 192 data points are arranged to form 6 data codewords and 18 error correction codewords, while in other embodiments, different numbers of data codewords and error correction codewords can be selected and used based on needs. In other optional embodiments, in the encoded region 15, a data point matrix composed of data points is not limited to 192 data points, and the size of the region of the data point matrix and the number of data points in the encoded region 15 can be adjusted based on needs to record more or less information.

In an optional embodiment, in the encoded region 15, if the number of the determined data codewords is k and the number of the error correction codewords is 2t, then the calculation formula for the side length of the encoded graph 1 formed by the encoded region 15 and the positioning blocks is:

$$a = \text{ceil}(2\sqrt{m^2 + 2k + 4t})$$

where, a is the side length of the encoded graph 1 formed by the encoded region 15 and the positioning blocks, m denotes the diameter of each positioning block, and ceil(x) denotes finding the smallest integer that is not smaller than x. In this embodiment, m is expressed using the side length of the region occupied by a data point in the encoded region 15 as an elemental unit, k and t are expressed using the side length of the region occupied by a data point in the encoded region 15 as an elemental unit as well. Therefore, the size of the obtained side length a of the encoded graph 1 is also expressed using the side length of the region occupied by a data point in the encoded region 15.

For example, in the embodiments shown in FIGS. 3A and 3B, m=4, k=6, t=9, a=16, and the encoded region 15 contains 192/8=24 codewords in total. Since there are 18 error correction codewords and every two error correction codewords can correct one error codeword, 9 error codewords can be corrected (this is determined by the RS error correction mechanism, reference can be made to the relevant technical information on RS error correction in related art), and the error tolerance rate can reach 37.5%, which is higher than the maximum error tolerance rate (about 30%) of QR codes, DM codes and other two-dimensional codes. Therefore, it has better error correction performance. In addition, the size of the encoded region 15 is 16×16, which is 42% smaller than the QR code of version 1 (the size without the static region is 21×21), therefore, it can be used for smaller calibration boards or other application scenarios that require codes of small size.

In the present application, when performing data encoding, every two-bit decimal codewords are grouped into one group, each group of decimal codewords are converted into one group of binary codewords. After every group of two-bit decimal codewords has been encoded, bit streams are arranged in sequence to form an encoded data. Error correction encoding is performed after the data encoding is completed, and the RS error correction encoding algorithm is specifically used for the error correction encoding. In order to prevent the concentration of data points of the same color, in the embodiment of the present application, a data mask matrix is used for processing, and the formula of the data mask matrix is:

$$\text{mask} = (\text{row} + \text{col}) \% 2$$

where, mask is a mask value, row is the row number of the data point in the encoded region 15, and col is the column number of the data point in the encoded region 5. Bit XOR operation is performed on the mask value and the encoded block value at the corresponding position to obtain a final encoded result. Then, the final encoded result is written in the data point matrix to obtain a final encoded region 15.

The advantage of using the data mask matrix to perform the bit XOR operation on the encoded region 15 is that when the encoded region is relatively large, it can prevent the occurrence of a situation where encoded blocks of black and white colors concentrate in the encoded region, and therefore improving the dividing efficiency during decoding.

The decoding process corresponding to the above-mentioned encoding is as follows.

Starting from the first row of encoded blocks in the encoded region 15, the data points are read in the reading order of the encoded blocks in the above description, until all the encoded blocks in the encoded region 15 are read, thereby obtaining a reading result. After performing bit XOR operation on the above reading result by using the above data mask matrix equation, an initial decoding is obtained. And then RS error correction decoding is performed on the initial decoding. If an error value of the error correction decoding does not exceed a set threshold (such as 9), it indicates that the original codewords can be restored correctly, and then the decoding result is output, and the decoding result is the correct codewords. If the error value exceeds the set threshold (such as 9), the decoding fails, and a decoding failure prompt message is returned.

Figure 13:
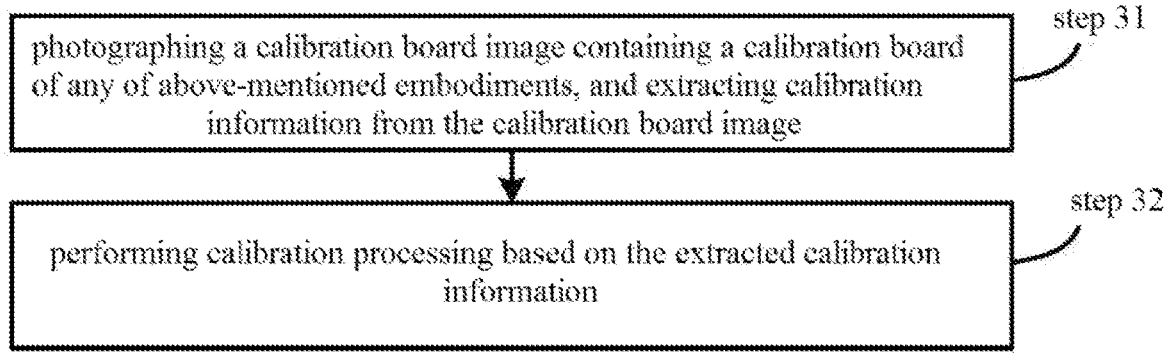
FIG. 13 is a flow chart of a calibration method provided by an embodiment of the present application.

An embodiment of the present application also provide a calibration method, as shown in FIG. 13, which mainly includes the following steps:

step 31, capturing a calibration board image containing a calibration board of any of above-mentioned embodiments, and extracting calibration information from the calibration board image;

step 32, performing calibration processing based on the extracted calibration information.

The calibration board information is the calibration information. The calibration board in the embodiment of the present application adopts the calibration board described in the above-mentioned embodiments. Specifically, referring to FIG. 10, FIG. 11, FIG. 3A, FIG. 3B, and FIG. 12, the calibration board includes a substrate 3, a feature pattern 4 and a coding graph 1. The feature pattern 4 is printed on the surface of the substrate 3, and the feature pattern 4 has a plurality of feature points. The encoded graph 1 is square and covers the feature pattern 4.

The encoded graph 1 includes a first positioning block 11, a second positioning block 12, a third positioning block 13, a fourth positioning block 14 and an encoded region 15. For the specific structure of the encoded graph 1 and the reading of the information recorded in the encoded region 15, reference can be made to the above description of FIG. 3A and FIG. 3B, which will not be repeated this time.

The encoded region 15 of the calibration board records calibration information of a marking point of the encoded graph 1, wherein the marking point coincides with one of the feature points in the feature pattern 4.

It should be noted that in a single-camera machine vision application, since only the relationship between the single camera and the object to be detected (i.e., the object being photographed) needs to be calibrated (this relationship is usually an affine transformation matrix), the number of encoded graph in the calibration board is only one. In a multi-camera machine vision application, due to the large application field of view, relationships between multiple cameras and the object to be detected (i.e., the object being photographed) need to be calibrated, or the relationships between multiple cameras needs to be calibrated, therefore, multiple encoded graphs are needed in the calibration board. Before the camera calibration application, it is necessary to determine the number and position of the encoded graph, the information carried by the encoded graph, and the size of the calibration board and other specifications. Then, a suitable calibration board can be made.

In the camera calibration application, the pose of the calibration board describes how the calibration board is displayed in the camera when there is a relative movement between the calibration board and the camera.

In some camera machine vision applications, a coordinate relationship between the camera and the moving object to be detected (i.e., the object being photographed) need to be calibrated, which is called hand-eye calibration. In the hand-eye calibration, the calibration boards will be placed in many different positions, so that the pose of the camera and the calibration board in the motion coordinate system can be determined.

In some other machine vision applications, there is no moving object to be detected (i.e. the object being photographed). Therefore, there is no need to calibrate the coordinate relationship between the camera and the object to be detected (i.e., the object being photographed), which is called non-hand-eye calibration. At this time, the calibration board can only use one pose.

In an optional embodiment, extracting calibration information from the calibration board image in step 31 may comprise:

step 311, searching for an encoded graph in the calibration board image, and reading calibration information of a marking point of the encoded graph recorded in the encoded region of the encoded graph; wherein, the marking point of the encoded graph is: a feature point that is pointed to by one specified vertex corner of four vertex corners of the encoded graph and is nearest to the specified vertex corner;

step 312, searching for a feature point in the calibration board image, obtaining a pixel coordinate of each feature point in the calibration board image, and determining an image indexing coordinate of each feature point in the calibration board image based on the pixel coordinate of each feature point in the calibration board image, wherein, the image indexing coordinate refers to: an indexing coordinate of a feature point in the calibration board image in all the feature points in the calibration board image;

step 313, correcting the image indexing coordinate and the physical coordinate of each feature point in the calibration board image, based on the calibration information of the marking point of the encoded graph.

In an optional embodiment, step 311 and step 312 are not necessarily performed in a strict order. Step 311 may be performed first and then step 312 may be performed, or step 312 may be performed first and then step 311 may be performed.

In an optional embodiment, in step 311, the direction of the encoded graph is determined by the first positioning block, the second positioning block, the third positioning block, and the fourth positioning block.

In an optional embodiment, in step 311, searching for an encoded graph in the calibration board image, and reading calibration information of a marking point of the encoded graph recorded in the encoded region of the encoded graph, may comprise:

step 3111, searching for four positioning blocks of the encoded graph in the calibration board image, and determining a direction of the encoded graph based on the found four positioning blocks; the four positioning blocks include a first positioning block, a second positioning block, a third positioning block and a fourth positioning block;

step 3112, searching for a marking point of the encoded graph in the calibration board image, determining a pixel coordinate of the marking point of the encoded graph in the calibration board image, and determining an image indexing coordinate of the marking point in all the feature points in the calibration board image based on the pixel coordinate of the marking point in the calibration board image and a pixel coordinate of each feature point of the calibration board image;

step 3113, determining a location of the encoded region in the calibration board image based on locations of the four positioning blocks in the encoded graph;

step 3114, reading the encoded region based on the direction of the encoded graph and the location of the encoded region, so as to obtain calibration information of the marking point of the encoded graph recorded in the encoded region.

The feature point that one specified vertex corner of four vertex corners of the encoded graph points to and is nearest to the specified vertex corner as a marking point of the encoded graph.

In an optional embodiment, for the positioning block in the form of a ring as shown in FIG. 3A and FIG. 3B, the execution process of searching for four positioning blocks in step 3111 may be:

first, performing image binarization processing on the calibration board image; then, determining a coordinate of the center of each positioning block in the calibration board image through Hough transform algorithm and by using the number of concentric circular rings and radius relationship;

taking centers of the four positioning blocks contained in the encoded graph as vertexes to construct a quadrilateral;

obtaining four inner corners of the constructed quadrilateral, and determining a positioning block at the largest inner corner in the four inner corners as a fourth positioning block;

determining a positioning block nearest to the fourth positioning block among the positioning blocks connected by two sides of the largest inner corner as a third positioning block, determining a positioning block furthest from the fourth positioning block among the positioning blocks connected by the two sides of the largest inner corner as a second positioning block, and determining the remaining positioning block as a first positioning block.

In an optional embodiment, determining a direction of the encoded graph based on the found fourth positioning blocks in step 3111 may comprise:

determining a side where the first positioning block and the second positioning block are located as an upper side of the encoded graph, determining a side where the third positioning block and the fourth positioning block are located as a lower side of the encoded graph, determining a side where the first positioning block and the third positioning block are located as a left side of the encoded graph, and determining the other side of the encoded graph opposite to the left side of the encoded graph as a right side of the encoded graph.

In an optional embodiment, step 3113 and step 3114 are executed in an encoded graph image with perspective distortion removed. The process for obtaining the encoded graph image with perspective distortion removed is as follows:

determining a homography matrix for perspective transformation based on the center coordinates of the four positioning blocks in the calibration board image and the center coordinates of the four positioning blocks without distortion during perspective transformation;

mapping all pixel points in the encoded graph to the non-perspective distortion plane using the homography matrix to obtain an encoded graph with perspective distortion removed.

In an optional embodiment, in step 3113, reading the encoded region based on the direction of the encoded graph and the location of the encoded region to obtain calibration information of the marking point of the encoded graph recorded in the encoded region may includes:

determining the encoded region based on the location of the encoded region, and determining a starting location of the encoded region based on the direction of the encoded graph;

performing binarization processing on the encoded region;

obtaining binary information recorded in the encoded region starting from the starting location of the encoded region;

obtaining an encoded data of the encoded region from the binary information recorded in the encoded region, based on an encoding scheme of the encoded region;

performing error correction decoding on the encoded data, and if an error value of the error correction decoding is smaller than a preset threshold value, taking a result of the decoding as calibration information of the marking point of the encoded graph.

The encoded region is a point matrix composed of data points, and the obtaining binary information recorded in the encoded region starting from a starting location of the encoded region may includes:

reading sequentially data points of each row in the point matrix starting from the first row adjacent to the upper side of the encoded graph in the point matrix after binarization processing, along the direction from the left side of the encoded graph to the right side of the encoded graph;

wherein, when reading a row divided by the fourth positioning block, first reading data points of the row on the left side of the fourth positioning block, then skipping the fourth positioning block, and continuing to read data points of the row on the right side of the fourth positioning block.

The above description only illustrate one of various reading sequences for obtaining each data point in the encoded region. In practical applications, an arrangement order of each data point can be specified, as long as the arrangement order is complied with when reading codes. In other optional embodiment, the obtaining binary information recorded in the encoded region starting from the starting location of the encoded region may comprise one of the following reading sequences:

1. reading sequentially data points of each column in the point matrix starting from the first column adjacent to the left side of the encoded graph in the point matrix after binarization processing, along a direction from the upper side of the encoded graph to the lower side of the encoded graph;

2. reading sequentially data points of each column in the point matrix starting from the first column adjacent to the left side of the encoded graph in the point matrix after binarization processing, along the direction from the lower side of the encoded graph to the upper side of the encoded graph;

3. reading sequentially data points of each column in the point matrix starting from the first column adjacent to the right side of the encoded graph in the point matrix after binarization processing, along the direction from the upper side of the encoded graph to the lower side of the encoded graph;

4. reading sequentially data points of each column in the point matrix starting from the first column adjacent to the right side of the encoded graph in the point matrix after binarization processing, along the direction from the lower side of the encoded graph to the upper side of the encoded graph.

In the embodiments of the present application, the arrangement order of data points may include more diversified methods. For example, one codeword (that is, 8 encoded blocks or data points) occupies two rows, each row has four columns, which are arranged in an order from top to bottom and from left to right. According to this arrangement, a corresponding order for reading encoded region is provided. For another example, the encoded region is divided into a plurality of scattered small regions, an arrangement order of each small region is specified, and an arrangement order of the data points in each small region is specified as well. When reading the encoded region, each data point in the encoded region is read according to the specified region and its arrangement order, as well as the arrangement order of the data points in each region.

In an optional embodiment, step 3114 is performed in the encoded graph with perspective distortion removed.

For the encoding scheme of the encoded region, reference can be made to the description in the above-mentioned embodiments of the calibration board.

In an optional embodiment, when obtaining an encoded data of the encoded region from the binary information recorded in the encoded region, first performing bit XOR processing on the obtained binary information and the data mask matrix to obtain pre-mask information, and obtaining an encoded data of the encoded region from the pre-mask information.

In a preferred embodiment, when performing error correction decoding on the encoded information, the error correction decoding is RS (Reed-Solomon) error correction decoding.

In an optional embodiment, step 312 may specifically comprise:

extracting an image edge of the feature pattern by using a Canny edge detection operator, extracting a straight line in the image edge by using Hough transform algorithm, and determining a pixel coordinate of a corner point (i.e., a feature point) of the feature pattern by an intersection point of straight lines. The image indexing coordinate of the corner point of the feature pattern is represented by (x,y), wherein, x represents column direction, and y represents row direction. For example, an index coordinate of a corner point (i.e. feature point) of the feature pattern which is nearest to the upper left corner of the calibration board image as (0,0); then each corner point (i.e. feature point) is given an image indexing coordinate from left to right and from up to bottom sequentially. In step 312, the obtained coordinate information of the feature point in the calibration board image includes the pixel coordinate of the feature point and the image indexing coordinate of the feature point.

In an optional embodiment, in the case where calibration information of a marking point of the encoded graph includes a calibration indexing coordinate of the marking point of the encoded graph in all the feature points of the calibration board and a physical distance between adjacent feature points in the calibration board, the correcting the image indexing coordinate and the physical coordinate of each feature point in the calibration board image based on the calibration information of the marking point of the encoded graph in step 313 includes:

step 3131, establishing a mapping relationship from the image indexing coordinate to the calibration indexing coordinate based on the image indexing coordinate and calibration indexing coordinate of the marking point of the encoded graph;

step 3132, converting image indexing coordinates of all the feature points in the calibration board image into calibration indexing coordinates using the mapping relationship;

step 3133, obtaining a physical coordinate of each feature point in the calibration board image based on the calibration indexing coordinate of each feature point in the calibration board image and a physical distance between adjacent feature points.

Figure 14:
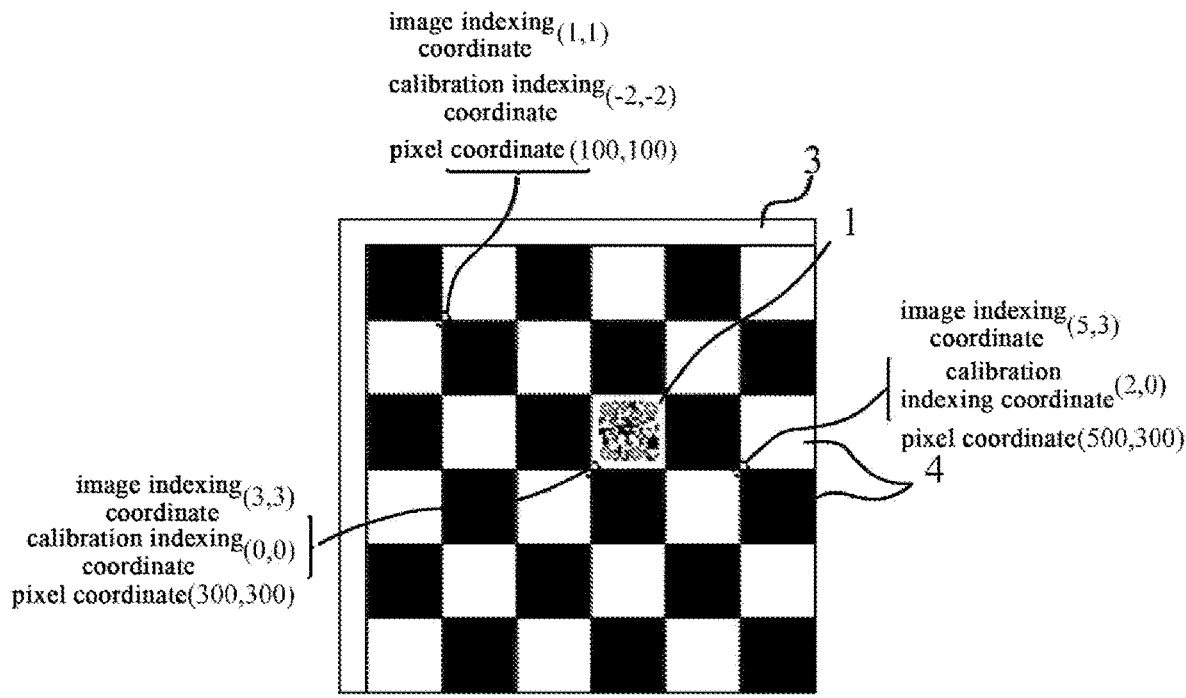
FIG. 14 is a schematic diagram of coordinate derivation in a calibration board provided by an embodiment of the present application.

FIG. 14 illustrates a schematic diagram of the coordinate derivation in the calibration board. In the embodiment shown in FIG. 14, the encoded graph 1 occupies a basic feature unit pattern, the corner point on the lower left corner of the encoded graph 1 is a marking point of the encoded graph 1, and the marking point coincides with a feature point at this position, that is, the coordinates of the marking point are the coordinates of the feature point at this position. In the embodiment shown in FIG. 14, the calibration indexing coordinate of the corner point on the lower left corner of the encoded graph 1 is (0, 0), and the calibration indexing coordinate is read from the encoded region in the encoded graph 1. The pixel coordinate of the corner point on the lower left corner of the encoded graph 1 (that is, the coordinate of the marking point in the calibration board image) is (300, 300), and the pixel coordinate of the feature point in the dashed box on the right of the encoded graph 1 (that is, the coordinate of the feature point in the calibration board image) is (500, 300). The pixel coordinate of the corner point on the lower left corner of the encoded graph 1 and the pixel coordinate of each feature point are obtained by searching for the encoded graph 1 in the calibration board image in step 311 and step 312.

In step 312, after obtaining pixel coordinates of each feature point in the calibration board image, image indexing coordinate of each feature point in the calibration board image are determined according to the pixel coordinates of each feature point in the calibration board image. For example, as shown in FIG. 14, the obtained pixel coordinate of the feature point in the uppermost left corner is (0, 0) and the image indexing coordinate of the feature point in the uppermost left corner is set to (0, 0), then the image indexing coordinate of each feature point in the calibration board image can be determined according to the pixel coordinate of each feature point in the calibration board image. For example, the pixel coordinate of the corner point on the lower left corner of the encoded graph 1 is (300,300). From the pixel coordinate of each feature point in the calibration board image, it can be seen that the corner point on the lower left corner of the encoded graph 1 is located at a position of three feature points on the lower side of the feature point on the uppermost left corner (that is, the image indexing coordinate is (0,0)), and the corner point on the lower left corner of the encoded graph 1 is located at a position of three feature points on the right side of the feature point on the uppermost left corner, then the image indexing coordinate of the corner point on the lower left corner of the encoded graph 1 is (3,3).

The pixel coordinate of the feature point (hereinafter referred to as a first feature point) in the dashed box on the right of the encoded graph 1 in FIG. 14 is (500, 300). From the pixel coordinate of each feature point in the calibration board image, it can be seen that the first feature point is located at a position of three feature points on the lower side of the feature point in the uppermost left corner (i.e., the feature point with the image indexing coordinates of (0,0)), and the first feature point is located at a position of five feature points on the right side of the feature point in the uppermost left corner, then the image indexing coordinate of the first feature point is (5, 3).

The pixel coordinate of the feature point (hereinafter referred to as a second feature point) in the dashed frame on the upper left of the encoded graph 1 in FIG. 14 is (100, 100). From the pixel coordinate of each feature point in the calibration board image, it can be seen that the second feature point is located at a position of one feature point on the lower side of the feature point in the uppermost left corner (that is, the feature point with the image indexing coordinates of (0,0)), and the second feature point is located at a position of one feature point on the right side of the feature point in the uppermost left corner, then the image indexing coordinate of the second feature point is (1,1).

It can be known by step 312 that the image indexing coordinate of the corner point (i.e., the marking point) on the lower left corner of the encoded graph 1 is (3, 3), the image indexing coordinate of the first feature point is (5, 3), and the image indexing coordinate of the second feature point is (1,1). It can be learned by step 311 that the calibration indexing coordinate of the lower left corner point (i.e., the marking point) of the encoded graph 1 is (0,0), then in step 3131, according to the image indexing coordinate (3,3) and calibration indexing coordinate (0,0) of the marking point, a mapping relationship from the image indexing coordinate to the calibration indexing coordinate is established as:

$$x'=x+ox$$

$$y'=y+oy$$

where, (x', y') is the calibration indexing coordinate of the feature point, (x, y) is the image indexing coordinate of the feature point, and ox and oy are the offsets in the x direction and y direction, respectively. In the embodiment shown in FIG. 14, it can be known from the image indexing coordinate (3, 3) and the calibration indexing coordinate (0, 0) of the marking point that, for the marking point, there are $$0=3+ox$$

$$0=3+oy$$

It can be concluded that ox is −3 and oy is −3. Then, in step 3132, from the image indexing coordinate (5, 3) of the first feature point and the above mapping relationship, the calibration indexing coordinate of the first feature point can be obtained as $$x'=5-3=2$$

$$y'=3-3=0$$

That is, the calibration indexing coordinate of the first feature point is (2, 0). In the same way, it can be inferred that the calibration indexing coordinate of the second feature point is (−2, −2). The calibration indexing coordinates of other feature points can be derived by this method.

In step 3133, the calibration indexing coordinate of each feature point is multiplied simply by the physical distance between adjacent feature points to obtain a physical coordinate of each feature point in the calibration board image. For example, if the physical distance between adjacent feature points is 10 mm, then the physical coordinate of the corner point (i.e., the marking point) at the lower left corner of the encoded graph 1 is (0,0), and the physical coordinate of the first feature point is (20 mm, 0), the physical coordinate of the second feature point is (−20 mm, −20 mm) and so on.

In an optional embodiment, in the case where the calibration information of the marking point of the encoded graph includes a physical coordinate of the marking point of the encoded graph in the calibration board, the correcting the image indexing coordinate and physical coordinate of each feature point in the calibration board image based on the calibration information of the marking point of the encoded graph in step 313 may comprise:

step 3131', receiving a physical distance between adjacent feature points in the calibration board inputted by a user;

step 3132', obtaining physical coordinates of all the feature points in the calibration board based on the physical coordinate of the marking point of the encoded graph in the calibration board and the physical distance between adjacent feature points in the calibration board.

Here, only the conversion relationship between the physical coordinates is involved. The content of step 3132' can be realized by combining the above description and the general coordinate conversion technology, which will not be repeated here.

Figure 15:
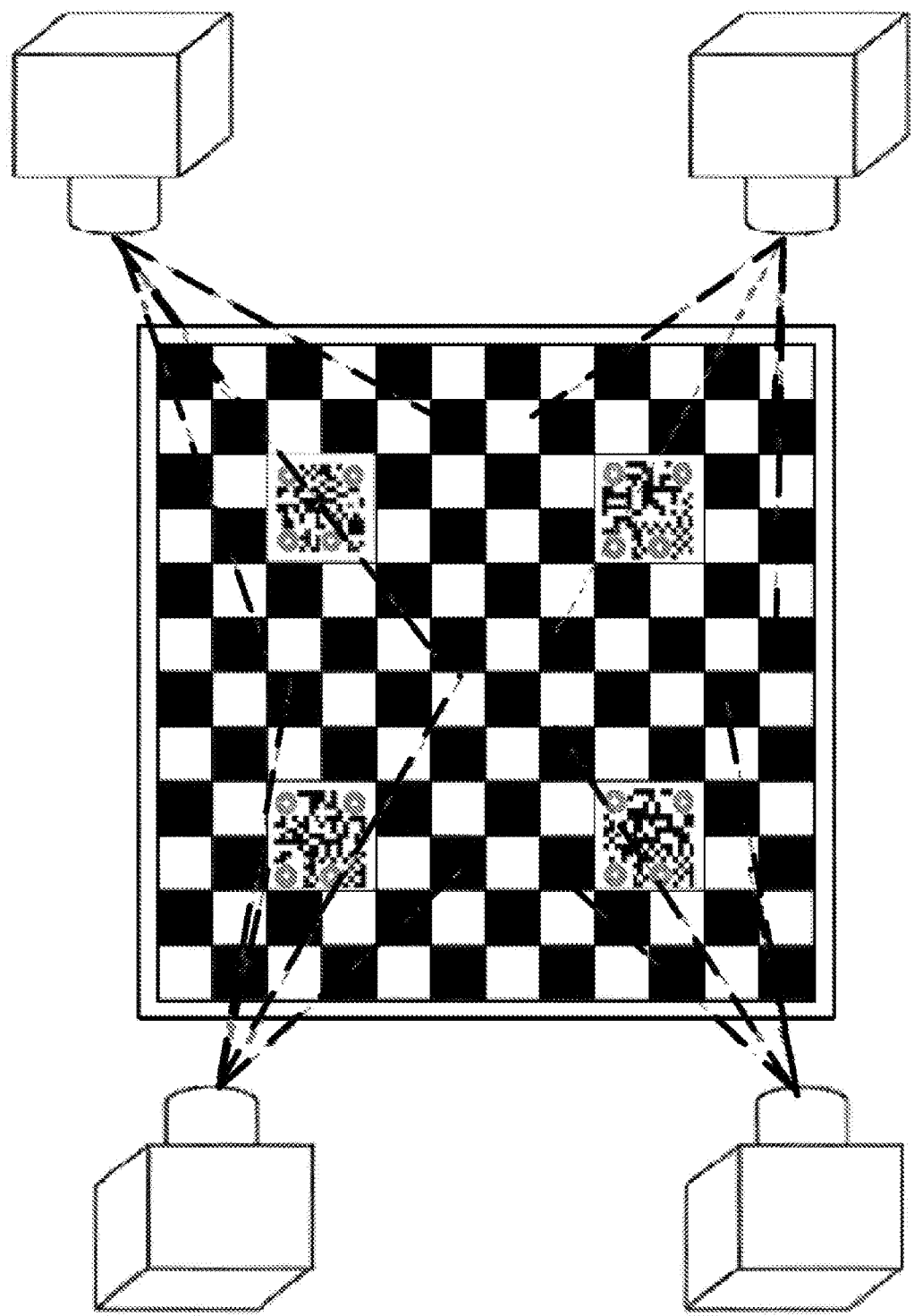
FIG. 15 is a schematic diagram of an application scenario of a calibration board provided by an embodiment of the present application.

The calibration board of the embodiments of the present application can be applied to the calibration of a machine vision application system of multiple cameras, as shown in FIG. 15. FIG. 15 depicts four cameras, but the machine vision application system can use fewer or more cameras to shoot the same scene. The field of view of each camera may or may not have an overlapping area, as shown in the dotted area in FIG. 15. Even, the machine vision application system can use only one camera.

Figure 16:
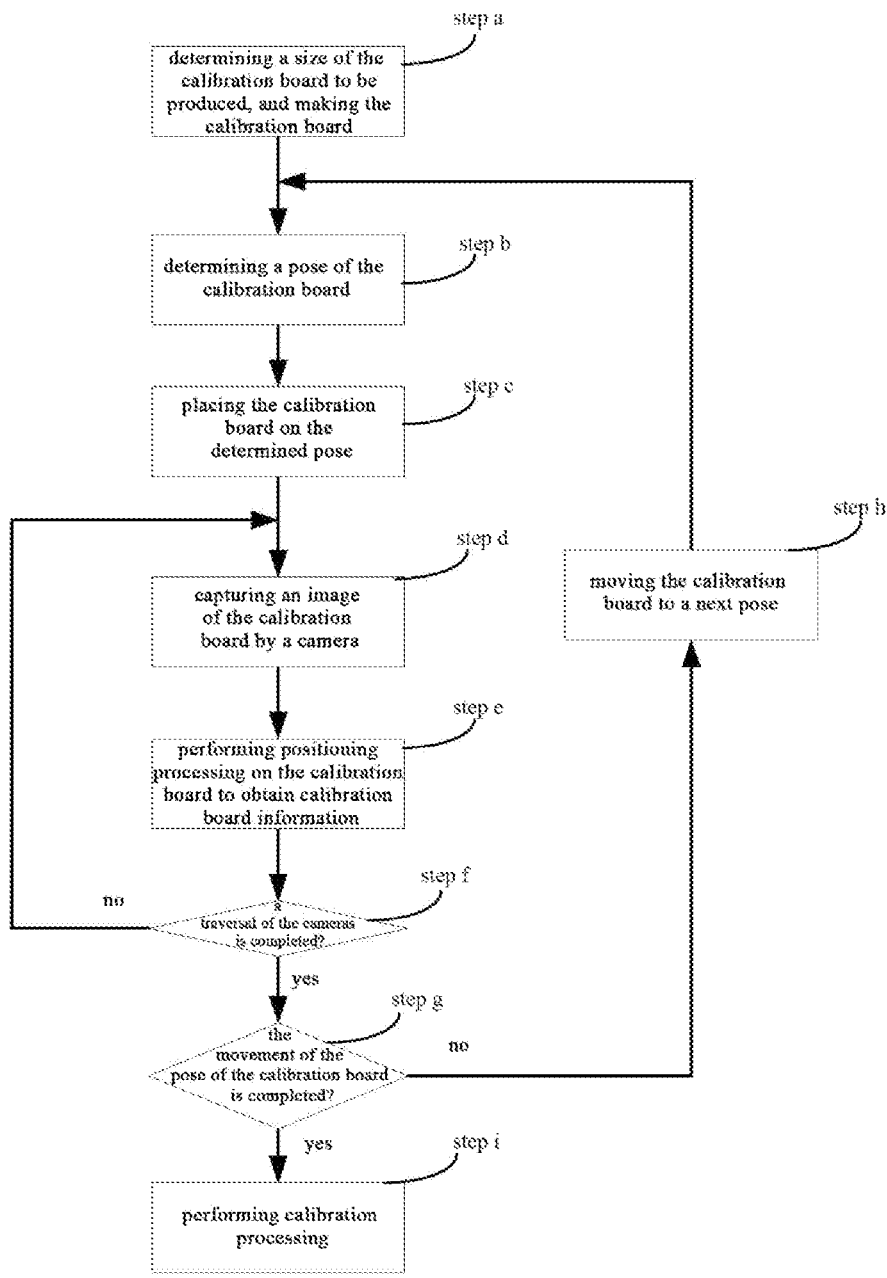
FIG. 16 is a flow chart of a specific execution of a calibration method provided by an embodiment of the present application.

FIG. 16 illustrates a process of multi-camera calibration using the calibration board of the embodiments of the present application, including:

step a: determining a size of a calibration board to be made, making the calibration board, and then proceeding to step b;

step b: determining a pose of the calibration board, and then proceeding to step c;

step c. placing the calibration board on the determined pose, and then proceeding to step d;

step d, capturing an image of the calibration board by a camera, and then proceeding to step e;

step e. performing positioning processing on the calibration board in the captured image of the calibration board to obtain calibration board information, and then proceeding to step f;

step f: determining whether a traversal of the cameras is completed, that is, determining whether all cameras have completed steps d and e, if yes, go to step g, otherwise return to step d;

step g, determining whether the movement of the pose of the calibration board is completed, if yes, go to step i, otherwise go to step h;

step h, moving the calibration board to a next pose, and then returning to step b;

step i: performing calibration processing.

In an optional embodiment, the calibration processing includes hand-eye calibration and non-hand-eye calibration, and both hand-eye calibration and non-hand-eye calibration can be implemented by using existing technologies, which will not be repeated here.

In the embodiments of the present application, the encoded region 15 shown in each figure is only for schematic illustration, and does not represent the actual encoded data recorded therein.

Embodiments of the present application further provide a non-volatile computer readable storage medium storing instructions that, when executed by a processor, cause the processor to execute steps in the encoding method described in any of the above respective embodiments.

Figure 17:
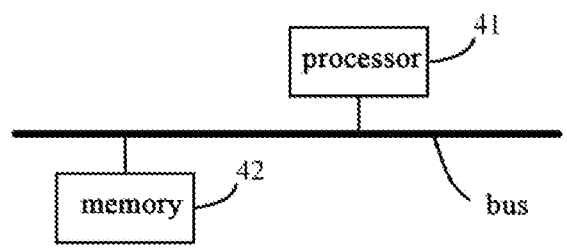
FIG. 17 is a schematic diagram of an electronic device provided by an embodiment of the present application.

Embodiments of the present application further provide an electronic device, the structure of which is shown in FIG. 17. The electronic device includes: at least one processor 41; and a memory 42 communicatively connected to the at least one processor 41; wherein, the memory 42 stores instructions that can be executed by the at least one processor 41, the instructions is executed by the at least one processor 41 so as to cause the at least one processor 41 to execute steps in the encoding method described in any of the above respective embodiments.

As shown in FIG. 17, the at least a processor 41 and the memory 42 realize a communication connection through a bus.

Embodiments of the present application also provide a computer program, wherein, the computer program, when being executed by a processor, causes the processor to execute steps in the encoding method described in any of the above respective embodiments. In the calibration board, the calibrating method, the electronic device and the non-volatile computer readable storage medium of the embodiments of the present application, an encoded graph containing direction information and calibration information is embedded in the feature pattern of the calibration board. Instead of using the calibration boards which are calibrated by using two-dimensional codes in related art, it saves the cost of using the two-dimensional code generating software in the related art, and is not limited to the use restrictions of the two-dimensional code generating software in the related art.

At the same time, the embodiments of the application use the fact that the encoded graph embedded in the calibration board can record calibration information of marking point, so that when the camera is performing calibration, the calibration information of the marking point can be obtained directly from the calibration board image, and then the indexing coordinate of the feature point in the calibration board and the physical distance between adjacent feature points can be obtained, or the physical coordinate of the feature point in the calibration board can be obtained. Therefore, it is not necessary to manually input the relevant information of the calibration board, and automatic calibration of the camera is realized, and the calibration efficiency and the calibration accuracy are improved.

In the embodiments of the present application, the four positioning blocks in the encoded graph can provide not only the direction information of the encoded graph, but also the direction information of the marking point, which realizes the multiplexing of marking the direction of the encoded graph and the direction of the calibration board.

In the embodiments of the present application, the size of the encoded graph can be flexibly set, and the encoded graph can be smaller than, equal to, or larger than the feature pattern of the calibration board, which enables flexible setting of the position and size of the encoded graph on the calibration board.

In the embodiments of the present application, the encoded region in the encoded graph contains data codewords and error correction codewords. The encoding and decoding scheme uses the RS encoding and decoding scheme, and bit XOR processing is performed on the binary information recorded in the encoded graph during decoding, thereby improving the decoding accuracy.

In addition, in the embodiments of the present application, an encoding scheme of 6 data codewords and 18 error correction codewords is used, which can achieve an error tolerance rate of 37.5%, which is higher than the maximum error tolerance rate of two-dimensional codes such as QR codes and DM codes. Therefore, the encoded graph in the embodiments of the present application has better error correction performance.

In addition, the size of the encoded region 15 is 16×16, which is 42% smaller than the QR code, therefore, it can be used for smaller calibration boards or other application scenarios that require codes of small size.

The above descriptions are only preferred embodiments of the present application and are not intended to limit the present application. Any modification, equivalent replacement, improvement made within the spirit and principle of the present application shall be included in the scope of protection of the present application.

What is claimed is:

1. An encoding method, comprising:
receiving data to be encoded;
encoding the data to be encoded to generate encoded data;
recording the encoded data in an encoded graph;
wherein, the encoded graph is a square, comprising:
a first positioning block located at a first corner region in the encoded graph;
a second positioning block located at a second corner region in the encoded graph, wherein, the second corner region and the first corner region are not located on a same diagonal line of the encoded graph;
a third positioning block located at a third corner region in the encoded graph, wherein, the third corner region and the second corner region are located on a same diagonal line of the encoded graph;
a fourth positioning block located in the encoded graph;
an encoded region located in a region not occupied by four positioning blocks in the encoded graph, and the encoded data is recorded in the encoded region, wherein the four positioning blocks comprise the first positioning block, the second positioning block, the third positioning block and the fourth positioning block;
wherein, in a quadrilateral formed by centers of the four positioning blocks, an inner corner at a location of the fourth positioning block is the largest inner corner of the quadrilateral, and a distance between the center of the fourth positioning block and the center of the third positioning block is smaller than a distance between the center of the fourth positioning block and the center of the second positioning block.

2. The encoding method of claim 1, wherein, after generating the encoded data and before recording the encoded data in the encoded graph, the method further comprises:
performing bit XOR processing on the encoded data with a data mask matrix to obtain processed encoded information;
the step of recording the encoded data in the encoded graph comprises:
recording the processed encoded information in the encoded graph.

3. The encoding method of claim 1, wherein, the encoded graph has a first edge, a second edge, a third edge, and a fourth edge;
the first positioning block is tangent to both the first edge and the second edge;
the second positioning block is tangent to both the second edge and the third edge;
the third positioning block is tangent to both the first edge and the fourth edge;
the fourth positioning block is tangent to only the fourth edge.

4. The encoding method of claim 3, wherein, the encoded region comprises a plurality of encoded blocks, and the step of recording the encoded data in the encoded graph comprises:
taking a row in which encoded blocks nearest to the second edge in the encoded region are located as a starting encoded row, taking a row in which encoded blocks nearest to the fourth edge in the encoded region are located as a final encoded row, and in each row of encoded blocks, taking a encoded block nearest to the first edge as a starting encoded block and taking a encoded block nearest to the third edge as a final encoded block, and recording the encoded data in the encoded region in an order from the starting encoded row to the final encoded row and an order from the starting encoded block to the final encoded block in each encoded row;
wherein, in the process of recording the encoded data in the encoded region:
when forming an encoded row interrupted by the fourth positioning block, forming encoded blocks in the encoded row with the fourth positioning block skipped.

5. The encoding method of claim 1, wherein, the four positioning blocks have a same shape and size, or
wherein, each of the four positioning blocks are composed of a plurality of circular rings that are concentric and have alternating colors; or
wherein the encoded region is a point matrix composed of by a plurality of encoded blocks, the encoded blocks are square points or circular points, and wherein, the encoded blocks comprise encoding blocks of two colors, wherein encoded blocks of one color represent 0, and encoded blocks of the other color represent 1.

6. The encoding method of claim 1, wherein, the encoded region comprises a plurality of encoded blocks, and before recording the encoded data in the encoded graph, the method further comprises:
determining a side length of the encoded graph based on encoded information, the encoded information comprising the number of bits of the encoded data, a side length of each encoded block in the encoded region, and a side length of a region occupied by any positioning block;
wherein, the side length of the encoded graph is positively correlated to the encoded information.

7. An electronic device, comprising:
at least one processor; and
a memory communicatively connected to the at least one processor; wherein,
the memory stores instructions that can be executed by the at least one processor, the instructions is executed by the at least one processor, so as to cause the at least one processor to execute steps in the encoding method of claim 1.

8. An encoded graph, which is a square, comprising:
a first positioning block located at a first corner region in the encoded graph;
a second positioning block located at a second corner region in the encoded graph, wherein, the second corner region and the first corner region are not located on a same diagonal line of the encoded graph;
a third positioning block located at a third corner region in the encoded graph, wherein, the third corner region and the second corner region are located on a same diagonal line of the encoded graph;
a fourth positioning block located in the encoded graph;
an encoded region located in a region not occupied by four positioning blocks in the encoded graph, and readable information is recorded in the encoded region, the four positioning blocks comprising the first positioning block, the second positioning block, the third positioning block and the fourth positioning block;
wherein, in a quadrilateral formed by centers of the four positioning blocks, an inner corner at a location of the fourth positioning block is the largest inner corner of the quadrilateral, and a distance between the center of the fourth positioning block and the center of the third positioning block is smaller than a distance between the center of the fourth positioning block and the center of the second positioning block.

9. The encoded graph of claim 8, wherein, the encoded graph has a first edge, a second edge, a third edge and a fourth edge;
the first positioning block is tangent to both the first edge and the second edge;
the second positioning block is tangent to both the second edge and the third edge;
the third positioning block is tangent to both the first edge and the fourth edge;
the fourth positioning block is tangent to only the fourth edge.

10. The encoded graph of claim 8, wherein, the four positioning blocks have a same shape and size, or
wherein, each of the four positioning blocks are composed of a plurality of circular rings that are concentric and have alternating colors;
or wherein the encoded region is a data point matrix composed of by a plurality of encoded blocks, the encoded blocks are square points or circular points, and wherein, the encoded blocks comprise encoding blocks of two colors, wherein encoded blocks of one color represent 0 and encoded blocks of the other color represent 1.

11. A calibration board, comprising:
a substrate;
a feature pattern printed to a surface of the substrate and containing a plurality of feature points;
the encoded graph of claim 8 covers the feature pattern.

12. The calibration board of claim 11, wherein, the feature pattern is: a checkerboard pattern, a dot pattern, or a hexagonal pattern; or
wherein, the number of the encoded graphs is at least one.

13. The calibration board of claim 11, wherein, the marking point of the encoded graph is:
a feature point that is pointed to by one specified vertex corner of four vertex corners of the encoded graph and is nearest to the specified vertex corner;

the calibration information of the marking point of the encoded graph comprises:
a calibration indexing coordinate of the marking point of the encoded graph in all the feature points of the calibration board, and a physical distance between adjacent feature points in the calibration board, wherein, the calibration indexing coordinate refers to: an indexing coordinate of the marking point recorded in the encoded region in all the feature points of the calibration board;
or, the calibration information of the marking point of the encoded graph comprises:
a physical coordinate of the marking point of the encoded graph in the calibration board; or
wherein, the encoded graph further comprises:
a static region in which the four positioning blocks and the encoded region are embedded, the static region being used for isolating the four positioning blocks and the encoded region from the feature pattern.

14. The calibration board of claim 11, wherein, the encoded region is a point matrix composed of data points, and the data points are square points or circular points;
the data points comprise data points of two colors, in which data points of one color represent 0, and data points of the other color represent 1;
and wherein,
the point matrix comprises a data points;
the a data points are arranged to form b data codewords and c error correction codewords, each codeword being a binary d bit; wherein,
the calibration information of the marking point is recorded in the b data codewords;
the error correction codewords are used for performing error correction decoding on the b data codewords;
wherein, a>1, b>1, c>b, d>1, and a=(b+c)xd;
and wherein, in the case where the calibration information of the marking point of the encoded graph comprises a calibration indexing coordinate of the marking point of the encoded graph in all the feature points of the calibration board, and a physical distance between adjacent feature points in the calibration board, the contents of the b data codewords after they are convered to be decimal contain: a column number and a row number of the marking point of the encoded graph in all the feature points of the calibration board, and/or a physical distance between adjacent feature points in the calibration board.

15. A calibration method, comprising:
photographing a calibration board image containing the calibration board of claim 11, and extracting calibration information from the calibration board image;
performing calibration processing based on the calibration information extracted.

16. The calibration method of claim 15, wherein, the step of extracting calibration information from the calibration board image comprises:
searching for the encoded graph in the calibration board image, and reading calibration information of a marking point of the encoded graph recorded in the encoded region; wherein, the marking point of the encoded graph is: a feature point that is pointed to by one specified vertex corner of four vertexes corner of the encoded graph and is nearest to the specified vertex corner;
searching for a feature point in the calibration board image, obtaining a pixel coordinate of each feature point in the calibration board image, and determining an image indexing coordinate of each feature point in the calibration board image based on the pixel coordinate of each feature point in the calibration board image, wherein, the image indexing coordinate refers to: an indexing coordinate of a feature point obtained in the calibration board image in all the feature points in the calibration board image;

correcting the image indexing coordinate and physical coordinate of each feature point in the calibration board image, based on the calibration information of the marking point of the encoded graph.

17. The calibration method of claim 16, wherein, the step of searching for an encoded graph in the calibration board image, and reading calibration information of a marking point of the encoded graph recorded in the encoded region, comprises:

searching for the four positioning blocks of the encoded graph in the calibration board image, and determining a direction of the encoded graph based on the found four positioning blocks;

searching for a marking point of the encoded graph in the calibration board image, determining a pixel coordinate of the marking point of the encoded graph in the calibration board image, and determining an image indexing coordinate of the marking point in all the feature points in the calibration board image based on the pixel coordinate of the marking point in the calibration board image and a pixel coordinate of each feature point in the calibration board image;

determining a location of the encoded region in the calibration board image based on locations of the four positioning blocks in the encoded graph;

reading the encoded region based on the direction of the encoded graph and the location of the encoded region, so as to obtain calibration information of the marking point of the encoded graph recorded in the encoded region;

wherein the step of searching for the four positioning blocks of the encoded graph in the calibration board image comprises:

taking centers of the four positioning blocks contained in the encoded graph as vertexes to construct a quadrilateral;

obtaining four inner corners of the quadrilateral, and determining a positioning block at the largest inner corner in the four inner corners as a fourth positioning block, determining a positioning block nearest to the fourth positioning block among the positioning blocks connected by two sides of the largest inner corner as a third positioning block, determining a positioning block furthest from the fourth positioning block among the positioning blocks connected by the two sides of the largest inner corner as a second positioning block, and determining the remaining positioning block as a first positioning block;

the step of determining a direction of the encoded graph based on the found fourth positioning blocks, comprises:

determining a side where the first positioning block and the second positioning block are located as an upper side of the encoded graph, determining a side where the third positioning block and the fourth positioning block are located as a lower side of the encoded graph, determining a side where the first positioning block and the third positioning block are located as a left side of the encoded graph, and determining the other side of the encoded graph opposite to the left side of the encoded graph as a right side of the encoded graph;

and wherein, the step of reading the encoded region based on the direction of the encoded graph and the location of the encoded region to obtain calibration information of the marking point of the encoded graph recorded in the encoded region, comprises:

determining the encoded region based on the location of the encoded region, and determining a starting location of the encoded region based on the direction of the encoded graph;

performing binarization processing on the encoded region;

obtaining binary information recorded in the encoded region starting from a starting location of the encoded region;

obtaining an encoded data of the encoded region from the binary information recorded in the encoded region based on an encoding scheme of the encoded region;

performing error correction decoding on the encoded data, and if an error value of the error correction decoding is smaller than a preset threshold value, taking a result of the decoding as calibration information of the marking point of the encoded graph.

18. The calibration method of claim 17, wherein:

when obtaining an encoded data of the encoded region from the binary information recorded in the encoded region, first performing bit XOR processing on the obtained binary information and a data mask matrix to obtain pre-mask information, and obtaining an encoded data of the encoded region from the pre-mask information.

19. The calibration method of claim 17, wherein, the encoded region is a point matrix composed of data points, and the obtaining binary information recorded in the encoded region starting from a starting location of the encoded region, comprises:

reading sequentially data points of each row in the point matrix starting from the first row adjacent to the upper side of the encoded graph in the point matrix after binarization processing, along a direction from the left side of the encoded graph to the right side of the encoded graph;

wherein, when reading a row divided by the fourth positioning block, first reading data points of the row on the left side of the fourth positioning block, then skipping the fourth positioning block, and continuing to read data points of the row on the right side of the fourth positioning block; or wherein, the encoded region is a point matrix composed of data points, and the obtaining binary information recorded in the encoded region starting from a starting location of the encoded region, comprises:

reading sequentially data points of each column in the point matrix starting from a first column adjacent to the left side of the encoded graph in the point matrix after binarization processing, along a direction from the upper side of the encoded graph to the lower side of the encoded graph; or reading sequentially data points of each column in the point matrix starting from a first column adjacent to the left side of the encoded graph in the point matrix after binarization processing, along the direction from the lower side of the encoded graph to the upper side of the encoded graph,; or reading sequentially data points of each column in the point matrix starting from a first column adjacent to the right side of the encoded graph in the point matrix after binarization processing, along a direction from the upper side of the encoded graph to the lower side of the encoded graph; or reading sequentially data points of each column in the point matrix starting from a first column adjacent to the right side of the encoded graph in the point matrix after binarization processing, along a direction from the lower side of the encoded graph to the upper side of the encoded graph.

20. The calibration method of claim 16, wherein, in the case where the calibration information of the marking point of the encoded graph comprises a calibration indexing coordinate of the marking point of the encoded graph in all the feature points of the calibration board and a physical distance between adjacent feature points in the calibration board, the correcting the image indexing coordinate and physical coordinate of each feature point in the calibration board image based on the calibration information of the marking point of the encoded graph, comprises:

establishing a mapping relationship from the image indexing coordinate to the calibration indexing coordinate based on the image indexing coordinate and calibration indexing coordinate of the marking point of the encoded graph;

converting image indexing coordinates of all the feature points in the calibration board image into calibration indexing coordinates using the mapping relationship;

obtaining a physical coordinate of each feature point in the calibration board image based on the calibration indexing coordinate of each feature point in the calibration board image and a physical distance between adjacent feature points; or wherein, in the case where the calibration information of the marking point of the encoded graph comprises a physical coordinate of the marking point of the encoded graph in the calibration board, the correcting the image indexing coordinate and physical coordinate of each feature point in the calibration board image based on the calibration information of the marking point of the encoded graph, comprises:

receiving a physical distance between adjacent feature points in the calibration board inputted by a user;

obtaining physical coordinates of all the feature points in the calibration board based on the physical coordinate of the marking point of the encoded graph in the calibration board and the physical distance between adjacent feature points in the calibration board.

21. A method for reading an encoded graph, comprising:
acquiring an image containing an encoded graph, the image is obtained by photographing an object surface containing the encoded graph;
recognizing four positioning blocks in the encoded graph in the image;
determining a mapping relationship of the encoded graph from the image to a non-perspective distortion plane based on the four positioning blocks, and transforming the encoded graph in the image into the non-perspective distortion plane based on the mapping relationship to obtain an encoded graph front view;
reading an encoded region in which readable information is recorded in the encoded graph front view to obtain information recorded by the encoded graph;
wherein, centers of the four positioning blocks form a quadrilateral, and the step of recognizing four positioning blocks in the encoded graph in the image comprises:

determining a positioning block at the largest inner corner of the quadrilateral as a fourth positioning block, determining a positioning block nearest to the fourth positioning block among positioning blocks connected by two sides of the largest inner corner as a third positioning block, determining a positioning block furthest from the fourth positioning block among the positioning blocks connected by the two sides of the largest inner corner as a second positioning block, and determining the remaining positioning block as a first positioning block.

22. The method for reading the encoded graph of claim 21, wherein, the step of determining a mapping relationship of the encoded graph from the image to a non-perspective distortion plane based on the four positioning blocks, comprising:

determining a mapping relationship of the encoded graph from the image to a non-perspective distortion plane, based on a center coordinate of the first positioning block, a center coordinate of the second positioning block, a center coordinate of the third positioning block, and a center coordinate of the fourth positioning block in the image, and a center coordinate of the first positioning block, a center coordinate of the second positioning block, a center coordinate of the third positioning block, and a center coordinate of the fourth positioning block in the non-perspective distortion plane, wherein, the step of determining a mapping relationship of the encoded graph from the image to a non-perspective distortion plane, based on a center coordinate of the first positioning block, a center coordinate of the second positioning block, a center coordinate of the third positioning block, and a center coordinate of the fourth positioning block in the image, and a center coordinate of the first positioning block, a center coordinate of the second positioning block, a center coordinate of the third positioning block, and a center coordinate of the fourth positioning block in the non-perspective distortion plane, comprises:

obtaining a homography matrix that characterizes the mapping relationship of the encoded graph from the image to the non-perspective distortion plane, based on the center coordinate of the first positioning block, the center coordinate of the second positioning block, the center coordinate of the third positioning block and the center coordinate of the fourth positioning block in the image, and the center coordinate of the first positioning block, the center coordinate of the second positioning block, the center coordinate of the third positioning block and the center coordinate of the fourth positioning block in the non-perspective distortion plane;

the transforming the encoded graph in the image into the non-perspective distortion plane based on the mapping relationship to obtain an encoded graph front view comprises:

transforming by projection of all pixel points of the encoded graph in the image to the non-perspective distortion plane using the homography matrix to obtain an encoded graph front view.

23. The method for reading the encoded graph of claim 21, wherein, the encoded region is located in a region not occupied by the four positioning blocks in the encoded graph; or wherein, the step of recognizing four positioning blocks in the encoded graph in the image, comprising:

recognizing four graphic objects that have a same shape and size in the encoded graph in the image;

determining the four graphic objects that have the same shape and size as the four positioning blocks;

and wherein, the step of determining the four graphic objects that have the same shape and size as the four positioning blocks, comprising:

determining four graphic objects, each of which is composed of a plurality of circular rings that are concentric and have alternating colors, as the four positioning blocks.

24. The method for reading the encoded graph of claim 21, wherein, the quadrilateral is constructed by the following steps:

extracting the centers of the four positioning blocks, and connecting the centers of the four positioning blocks sequentially to form the quadrilateral; or wherein, in a square plane region of the non-perspective distortion plane:

the first positioning block is located at a first corner region in the square plane region;

the second positioning block is located at a second corner region in the square plane region, and the second corner region and the first corner region are not located on a same diagonal line;

the third positioning block is located at a third corner region in the square plane region, and the third corner region and the second corner region are located on a same diagonal line;

the fourth positioning block is located in the square plane region, and in the quadrilateral, an inner corner at a location of the fourth positioning block is the largest inner corner of the quadrilateral, and a distance between the center of the fourth positioning block and the center of the third positioning block is smaller than a distance between the center of the fourth positioning block and the center of the second positioning block.

25. The method for reading the encoded graph of claim 21, wherein, the encoded region comprises a plurality of encoded blocks, and the step of reading an encoded region in which readable information is recorded in the encoded graph front view to obtain information recorded by the encoded graph, comprises:

in four edges of the encoded graph in the encoded graph front view, taking an edge that is tangent to both the first positioning block and the third positioning block as a first edge, taking an edge that is tangent to both the first positioning block and the second positioning block as a second edge, taking an edge that is tangent to only the second positioning block as a third edge, and taking an edge that is tangent to both the third positioning block and the fourth positioning block as a fourth edge;

taking a row in which encoded blocks nearest to the second edge in the encoded region recording readable information are located in the encoded graph front view as a starting encoded row, taking a row in which encoded blocks nearest to the fourth edge in the encoded region are located as a final encoded row, and in each row of encoded blocks, taking an encoded block nearest to the first edge as a starting encoded block and taking an encoded block nearest to the third edge as a final encoded block, and reading each encoded block in an order from the starting encoded row to the final encoded row and an order of from the starting encoded block to the final encoded block in each encoded row, so as to obtain information recorded in the encoded graph, and wherein, when reading an encoded row interrupted by the fourth positioning block, reading encoded blocks in the encoded row with the fourth positioning block skipped.

26. The method for reading the encoded graph of claim 21, wherein, after reading the encoded region, the method further comprises:

performing error correction decoding on the information obtained by reading the encoded region to obtain an error-corrected codeword and an error number;

if the number of errors does not exceed an error correction capacity, outputting the error-corrected codeword, and wherein, before performing error correction decoding, the method further comprises:

performing bit XOR processing on the information obtained by reading the encoded region with a data mask matrix to obtain processed information;

the step of performing error correction decoding on the information obtained by reading the encoded region to obtain an error-corrected codeword and an error number, comprises:

performing error correction decoding on the processed information to obtain an error-corrected codeword and an error number.

27. An electronic device, comprising:

at least one processor; and a memory communicatively connected to the at least one processor; wherein, the memory stores instructions that can be executed by the at least one processor, the instructions is executed by the at least one processor, so as to cause the at least one processor to execute steps in the method for reading the encoded graph of claim 19.

* * * * *

UNITED STATES PATENT AND TRADEMARK OFFICE
CERTIFICATE OF CORRECTION

PATENT NO. : 11,843,395 B2
APPLICATION NO. : 17/624953
DATED : December 12, 2023
INVENTOR(S) : Xu Yang It is certified that error appears in the above-identified patent and that said Letters Patent is hereby corrected as shown below:

In the Specification

In Column 17, Line 50, "a⊕c = a⊕(a⊕b) = (a⊕a)⊕b = 0⊕b" should read
-- a⊕c = a⊕(a⊕b) = (a⊕a)⊕b = 0⊕b = b --

In Column 18, approximately Line 67, "$a'=\text{ceil}(2\sqrt{m^2+2k+4t_i}+2q$" should read
-- $a' = \text{ceil}(2\sqrt{m^2 + 2k + 4t}) + 2q$ --

Signed and Sealed this
Thirty-first Day of December, 2024

Derrick Brent
*Acting Director of the United States Patent and Trademark Office*